US011505351B2

(12) United States Patent
Krueger et al.

(10) Patent No.: US 11,505,351 B2
(45) Date of Patent: Nov. 22, 2022

(54) MACHINE AND METHOD FOR COATING CONTAINERS

(71) Applicant: KRONES AG, Neutraubling (DE)

(72) Inventors: Jochen Krueger, Hagelstadt (DE); Michael Neubauer, Grassau (DE)

(73) Assignee: KRONES AG

( * ) Notice: Subject to any disclaimer, the term of this patent is extended or adjusted under 35 U.S.C. 154(b) by 239 days.

(21) Appl. No.: 16/719,589

(22) Filed: Dec. 18, 2019

(65) Prior Publication Data

US 2020/0189782 A1 Jun. 18, 2020

(30) Foreign Application Priority Data

Dec. 18, 2018 (DE) .................. 10 2018 132 609.2

(51) Int. Cl.
*B65B 55/04* (2006.01)
*B05D 7/22* (2006.01)

(52) U.S. Cl.
CPC .............. *B65B 55/04* (2013.01); *B05D 7/227* (2013.01)

(58) Field of Classification Search
CPC ....... B05D 7/227; B65B 55/04; C23C 16/045; C23C 16/458; C23C 16/50; C23C 16/54
See application file for complete search history.

(56) References Cited

U.S. PATENT DOCUMENTS

| 6,328,805 | B1 * | 12/2001 | Rius .................. | H01J 37/32834 |
| | | | | 118/715 |
| 6,332,484 | B1 * | 12/2001 | Stahlecker ............ | B67C 7/0026 |
| | | | | 141/129 |
| 2005/0227002 | A1 * | 10/2005 | Lizenberg ............... | B08B 9/426 |
| | | | | 427/230 |
| 2013/0004682 | A1 * | 1/2013 | Siebels ................. | C23C 16/511 |
| | | | | 427/569 |

(Continued)

FOREIGN PATENT DOCUMENTS

| DE | 199 21 274 | 9/2000 | ............... B67C 7/00 |
| DE | 102 36 683 | 2/2004 | ............... B01J 19/08 |

(Continued)

OTHER PUBLICATIONS

European Search Report (w/machine translation) issued in application No. 19217465.4, dated Jun. 2, 2020 (15 pgs).

(Continued)

*Primary Examiner* — Andrew M Tecco
*Assistant Examiner* — Nicholas E Igbokwe
(74) *Attorney, Agent, or Firm* — Hayes Soloway P.C.

(57) ABSTRACT

A device for coating containers includes at least one vacuum device for generating a vacuum, and at least one treatment station for coating containers with a plasma, wherein the treatment station is in fluid communication with the vacuum device and wherein the treatment station has at least one treatment device which can be introduced into a container, a conveyor device for transporting containers on a transport (Continued)

path P and at least one support element to receive at least one container, wherein the support element is movable in a direction perpendicular to the transport path P of the containers and is suitable for introducing the container into a treatment station, wherein a closure element is arranged on the support element and the closure element is suitable for closing the treatment station in an airtight manner.

8 Claims, 20 Drawing Sheets

(56) References Cited

U.S. PATENT DOCUMENTS

2013/0209703 A1* 8/2013 Kruger .................. C23C 16/509
427/569

FOREIGN PATENT DOCUMENTS

| DE | 10236683 A1 * | 2/2004 | ................ B67C 3/22 |
| DE | 10314067 | 10/2004 | ............. C03C 17/00 |
| DE | 60022377 | 6/2006 | ................ B65B 1/00 |
| DE | 102012201956 | 8/2013 | ............. C23C 16/04 |
| EP | 3 318 658 | 9/2018 | ........... C23C 16/455 |

OTHER PUBLICATIONS

German Search Report (w/machine translation) issued in application No. 10 2018 132 609.2, dated Aug. 26, 2019 (13 pgs).

* cited by examiner

|  | cycle: | time: | switching station: |
|---|---|---|---|
| 1. run | 1 | 0 s | S1 |
| | 2 | 1.185 s | S6 |
| | 3 | 2.37 s | S2 |
| | 4 | 3.555 s | S7 |
| | 5 | 4.74 s | S3 |
| | 6 | 5.925 s | S8 |
| | 7 | 7.11 s | S4 |
| | 8 | 8.295 s | S9 |
| | 9 | 9.48 s | S5 |
| | 10 | 10.665 s | S10 |
| 2. run | 1 | 11.85 s | S1 |
| | 2 | 13.035 s | S6 |
| | 3 | 14.22 s | S2 |
| | 4 | 15.405 s | S7 |
| | 5 | 16.59 s | S3 |
| | 6 | 17.775 s | S8 |
| | 7 | 18.96 s | S4 |
| | 8 | 20.145 s | S9 |
| | 9 | 21.33 s | S5 |
| | 10 | 22.515 s | S10 |
| 3. run | 1 | 23.7 s | S1 |
| | 2 | 24.885 s | S6 |
| | 3 | 26.07 s | S2 |
| | 4 | 27.255 s | S7 |
| | 5 | 28.44 s | S3 |
| | 6 | 29.625 s | S8 |
| | 7 | 30.81 s | |
| | 8 | | |

Fig. 13b

| | vacuum supply 1 | | | vacuum supply 2 | | |
|---|---|---|---|---|---|---|
| | cycle: | time: | switching station: | cycle: | time: | switching station: |
| 1. run | 1 a | 0.000 s | S1 | 1 b | 0.600 s | S10 |
| | 2 a | 1.192 s | S2 | 2 b | 1.792 s | S11 |
| | 3 a | 2.383 s | S3 | 3 b | 2.983 s | S12 |
| | 4 a | 3.575 s | S4 | 4 b | 4.175 s | S13 |
| | 5 a | 4.767 s | S5 | 5 b | 5.367 s | S14 |
| | 6 a | 5.958 s | S6 | 6 b | 6.558 s | S15 |
| | 7 a | 7.150 s | S7 | 7 b | 7.750 s | S16 |
| | 8 a | 8.342 s | S8 | 8 b | 8.942 s | S17 |
| | 9 a | 9.533 s | S9 | 9 b | 10.133 s | S18 |
| 2. run | 1 a | 10.725 s | S1 | 1 b | 11.325 s | S10 |
| | 2 a | 11.917 s | S2 | 2 b | 12.517 s | S11 |
| | 3 a | 13.108 s | S3 | 3 b | 13.708 s | S12 |
| | 4 a | 14.300 s | S4 | 4 b | 14.900 s | S13 |
| | 5 a | 15.549 s | S5 | 5 b | 16.092 s | S14 |
| | 6 a | 16.683 s | S6 | 6 b | 17.283 s | S15 |
| | 7 a | 17.875 s | S7 | 7 b | 18.475 s | S16 |
| | 8 a | 19.067 s | S8 | 8 b | 19.667 s | S17 |
| | 9 a | 20.258 s | S9 | 9 b | 20.858 s | S18 |
| 3. run | 1 a | 21.450 s | S1 | 1 b | 22.050 s | S10 |
| | 2 a | 22.642 s | S2 | 2 b | 23.242 s | S11 |
| | 3 a | 23.833 s | S3 | 3 b | 24.433 s | |
| | 4 a | 25.025 s | S4 | | | |
| | 5 a | 26.217 s | S5 | | | |
| | 6 a | 27.408 s | S6 | | | |
| | 7 a | 28.600 s | | | | |
| | 8 a | 29.792 s | | | | |

Fig. 14b

|  | cycle: | time: | switching station: |
|---|---|---|---|
| 1. run | 1 | 0 s | S1 |
|  | 2 | 2.35 s | S4 |
|  | 3 | 4.7 s | S2 |
|  | 4 | 7.05 s | S5 |
|  | 5 | 9.4 s | S3 |
|  | 6 | 11.8 s | S6 |
| 2. run | 1 | 14.1 s | S1 |
|  | 2 | 16.5 s | S4 |
|  | 3 | 18.8 s | S2 |
|  | 4 | 21.2 s | S5 |
|  | 5 | 23.5 s | S3 |
|  | 6 | 25.9 s | S6 |
| 3. run | 1 | 28.2 s | S1 |
|  | 2 | 30.6 s | S4 |
|  | 3 | 32.9 s | S2 |
|  | 4 | 35.3 s | S5 |
|  | 5 | 37.6 s |  |

Fig. 15b

MACHINE AND METHOD FOR COATING CONTAINERS

BACKGROUND OF THE INVENTION

The present invention relates to a machine and a method for treating containers, Such treatment devices for containers are predominantly constructed as rotary machines in the prior art. This construction has several advantages. Thus, for example in the case of rotary machines high machine outputs are possible.

However, rotary machines also have several disadvantages. Thus, on the one hand, they have large moving masses. On the other hand, it is disadvantageous that the treatment stations are located on the rotating part of the rotary machines. Both the treatment stations themselves and also the process media (for example filling medium in the case of bottle filling machines, ink in the case of printing machines, etc.) are therefore exposed to high centrifugal forces. Moreover, in this case a costly rotary feedthrough for the power and media supply is necessary. In addition, rotary machines are relatively inflexible. An expansion of the plant is only possible with difficulty. The entire plant must also be at a standstill when only one individual treatment station is to undergo maintenance.

Therefore, the object of the invention is to provide a machine and a method which does not have these said disadvantages.

SUMMARY OF THE INVENTION

A machine according to the invention for treating containers has at least one transport device for transporting the containers. The machine according to the invention has a manipulating device for transferring a pre-defined plurality of containers from the transport device in a transfer region and for delivering these containers to the transport device or a further transport device in a delivery region. Moreover, the machine according to the invention has at least one further manipulating device for transferring a pre-defined plurality of containers from the transport device in a further transfer region and for delivering these containers to the transport device or a further transport device in a further delivery region. In this case the manipulating devices in each case have a movable support by which the removed containers can be moved on a transport path. Furthermore, in each case at least one treatment station is associated with the manipulating device.

According to the invention the transport speed of the manipulating devices is controllable in such a way that the transport speed of the manipulating devices during the transfer and/or delivery of the containers can be synchronised with the transport speed of the transport device and/or the further transport device. According to the invention the transport speed of the manipulating device can be reduced after the transfer of the containers.

In this case the term "transport speed" is understood to mean the speed at which containers are moved along a transport path.

In an advantageous embodiment the transport speed can be reduced to zero. The speed of the containers can be reduced until the containers are at a standstill, preferably in the region of the treatment stations.

The movable support is advantageously a rotatable support. However, it can also be for example a pivotable support. Advantageously all manipulating devices have the same revolving direction. A manipulating device preferably has at least one manipulating unit to receive a container. A manipulating device particularly preferably has a plurality of manipulating units, each of which is suitable to receive a container.

The manipulating units can preferably be retaining devices or the like which receive the containers. They are preferably grippers, such as for example neck handling clips which grip the containers.

However, other configurations of the manipulating devices are also conceivable. Instead of the rotary (lifting) mechanism, the manipulating device could for example also have a portal system, a tripod robot or a robot arm in order, for receiving and delivering containers, to synchronise with the continuously running transport device and subsequently to bring the containers to the processing stations.

In an advantageous embodiment the containers are transported by the transport device along an infeed path. The transfer regions to the manipulating devices are preferably located along this infeed path. A discrete transfer region is advantageously associated with each manipulating device. The number of transfer regions is preferably identical to the number of manipulating devices. The machine advantageously has a plurality of manipulating devices. A plurality of transfer regions is preferably located along the infeed path of the transport device.

Thus, in a preferred embodiment one or more containers are transferred to a manipulating device, whilst the other containers are transported further by the transport device. The containers which are further transported are advantageously transferred to a further manipulating device.

The transfer region is advantageously an exactly defined spatial region. This means in particular that each container which is transferred to a specific manipulating device is transferred within this transfer region. The transfer region is advantageously smaller than 10 cm, preferably smaller than 5 cm and particularly preferably smaller than 1 cm.

In an advantageous embodiment each manipulating device in its transfer region removes one or more containers from the infeed. The manipulating device preferably removes the containers with a rotational movement. If a plurality of containers is transferred to the manipulating device, these containers are preferably transferred successively in the transfer region, that is to say substantially at the same transfer point. Alternatively, the containers are removed from the infeed by a removing device, for example a robot, and transferred to the treatment stations. In this embodiment a transfer of the containers does not take place at the same transfer point.

The delivery region is advantageously an exactly defined spatial region. This means in particular that each container which is delivered by a specific manipulating device is delivered within this delivery region. The delivery region is advantageously smaller than 10 cm, preferably smaller than 5 cm and particularly preferably smaller than 1 cm.

In an advantageous embodiment each manipulating device in its delivery region delivers one or more containers to the infeed. The manipulating device preferably delivers the containers with a rotational movement. If the manipulating device delivers a plurality of containers, these containers are preferably delivered successively in the transfer region, that is to say substantially at the same delivery point. Alternatively, the containers are removed from the treatment stations by a delivery device, for example a robot, and are transferred to the discharge. In this embodiment a transfer of the containers does not take place at the same transfer point.

A plurality of processing stations is preferably associated with each manipulating device. Advantageously each manipulating device has at least the number of treatment stations which corresponds to the pre-defined number of containers which are transferred to the manipulating device in a cycle at the transfer point. The manipulating device preferably has exactly this number of processing stations. If for example four containers are transferred to the manipulating device in a cycle, this manipulating device preferably also has at least four processing stations.

In a preferred embodiment the processing stations are arranged stationary.

Advantageously a treatment station is suitable for treating at least one container. The treatment stations can be for example stations for a filling and/or closing process, a stretch blow moulding process, a decorating process or a coating process. In a stationary arrangement of treatment stations for a stretch blow moulding process the advantage lies in the fact that the heavy blow moulding station with its many media supplies no longer has to be seated on a rotating blow moulding wheel, but can simply be placed stationary in the machine. This produces a considerable cost advantage. Treatment stations for a decorating process can be for example stations for labelling and/or printing. A processing station for a coating process may involve stations for coating of the inner and/or outer face of the container. In particular in this case it may involve stations for plasma coating. Advantageously each processing station has a vacuum chamber. The machine preferably also has at least one vacuum pump.

In a preferred embodiment the treatment station is arranged downstream of the transfer region and/or upstream of the delivery region relative to the transport path of the containers. This arrangement preferably applies for each of the processing stations. This means that initially in a transfer region, containers are transferred onto a manipulating device, are supplied to a treatment station arranged downstream and after treatment are delivered by the manipulating device in a delivery region.

In an advantageous embodiment the transfer region and the delivery region of a manipulating device are arranged spatially separately from one another. The delivery region is preferably arranged after a 180° rotation of the manipulating device starting from the transfer region.

In a clockwise revolving direction, an exemplary cycle of the manipulating device appears as follows: The manipulating device at "12 o'clock" rotates synchronously with the transport device and removes one or more containers. After leaving the collision region with the subsequent containers the manipulating device retards its rotation until it comes to a standstill at the "3 o'clock" position. Now the treatment takes place. Then the manipulating device accelerates in order in the "6 o'clock" position to be synchronised with the discharge part of the transport device and to be able to deliver the container(s). The rotation of the manipulating device is now continued without containers up to the "12 o'clock" position. A new cycle can start here.

In this embodiment the manipulating device can preferably be arranged along a transfer oval, that is to say on a transport device in which the containers are moved along an oval transport path. Preferably in this case the manipulating devices can be arranged for example inside the transfer oval, that is to say on the side of the transport device facing the central point of the curvature.

In this case the containers can be transferred to the manipulating devices advantageously in the first linear region of the transfer oval. The containers are then transported from the manipulating devices to treatment stations which are located inside the transfer oval. After the treatment the containers are transported further by the manipulating device and in the second linear region of the transfer oval, which is opposite the first, the containers are delivered to the transport device again. In this embodiment only one individual transport device is necessary, because the containers are transferred from the same transport device and after the treatment, they are delivered to this transport device again.

As an alternative to this, however, two transport devices can also be used. For example in this case the manipulating devices can be arranged between two linear regions of two different transfer ovals. In this case the manipulating devices can pick up containers from one transport device, can transport the containers to treatment stations between the transport devices and, after the treatment, can deliver the containers to the second transport device. Advantageously in such an embodiment the linear sections of the two transport devices, from which the containers are transferred or to which the containers are delivered, are arranged parallel to one another.

In an alternative preferred embodiment, the transfer region and the delivery region of a manipulating device are not arranged spatially separated from one another, but the delivery region of a manipulating device corresponds spatially to the transfer region of a manipulating device. Thus, advantageously the manipulating device is suitable for picking up or delivering containers in the same region. Particularly preferably the manipulating device is suitable for alternately receiving and delivering containers.

Whilst in the previously described embodiment the manipulating device has two contact points (transfer or delivery region) with the transport device, in this embodiment only one contact point is necessary. In the embodiment initially described, more mechanical setting work is necessary, since a setting of a point leads to a displacement of the other point. In the alternatively described embodiment there is only one contact point, which significantly simplifies the installation and adjustment of the machine.

Advantageously in this embodiment instead of a separate infeed and discharge starwheel, only one starwheel or another suitable transport device, such as for example a transfer chain, is required, by means of which the containers can be fed to the transport device and can be discharged therefrom.

In a preferred embodiment the transport device is configured in such a way that it transports the plastic parisons in a predetermined and in particular also uniform orientation relative to the longitudinal axis thereof. The transport device advantageously has a plurality of transport units for each transporting a container. Advantageously the transport units are retaining devices or the like which receive the containers to be transported. They are preferably grippers, such as for example neck handling cups which grip the containers.

In an advantageous embodiment the transport device and/or a further transport device is a linear transport device. The term "linear transport device" should be understood to mean that the transport takes place linearly at least in part. In this case it is not ruled out that the transport takes place in part also on a curved path. The transport device can be designed for example as a transfer oval. A purely linear transfer is also conceivable. Alternatively, it would also be conceivable to design the transport device as a transport carousel. A transport device in the form of starwheel columns is also conceivable.

For example, a linear transport device, in particular a conveyor belt, a transport chain or an individual transport by means of linear motor, can be used. Thus, the transport device can be for example a chain-based or belt-based system. Alternatively, the use of a long stator linear motor would also be conceivable.

In a preferred embodiment the manipulating devices are arranged laterally on the transport device. The manipulating devices are advantageously positioned relative to the transport device so that in a suitable manner they remove objects to be treated from the transport device or, after treatment has taken place, can deliver the objects to the transport device.

In the case of an at least partially curved transport path the manipulating devices are preferably arranged on the side of the transport device facing away from the central point of the curvature. In the case of a transport carousel the manipulating devices are preferably arranged outside the transport carousel—like satellites. Also, in the case of a transport oval the manipulating devices are preferably arranged on the "outer face" outside the region enclosed by the transport oval.

The treatment stations are preferably also arranged on the side of the transport device facing away from the central point of the curvature. In this way a better accessibility of the manipulating devices and the treatment stations can advantageously be ensured, since they are not located inside the transport carousel/transport oval, but outside.

Particularly preferably in the preferred embodiment this arrangement of the manipulating devices is selected, in which the delivery region of the manipulating device corresponds spatially to the transfer region of the manipulating device.

In an advantageous embodiment the axes of rotation of the manipulating devices are arranged in such a way that the axis of rotation of one manipulating device is arranged in the pivot circle of the axis of rotation of a further manipulating device.

Advantageously the manipulating devices are arranged substantially equidistantly. The term "substantially" relates on the one hand to the fact that the distances between the individual manipulating devices deviate from one another by no more than 30%, preferably by no more than 20% and particularly preferably by no more than 10%.

On the other hand, however, the term "substantially" relates to the fact that it should not be ruled out that the distance between individual manipulating devices can deviate significantly therefrom. Thus the term "substantially equidistant" should for example also cover an arrangement with a transport oval, wherein although the distances between the manipulating devices in the region of one or the other linear section are equal, in the curved region of the transport device, however, other distances occur, or also that no manipulating devices are actually arranged in this transport region. Accordingly the term "substantially equidistant" should also cover an exemplary embodiment in which the manipulating devices a to e are arranged in a linear section of a transport oval, after the manipulating device e a curved transport section of the transport oval without manipulating devices follows, and the manipulating devices f to j are arranged in a further linear section.

In a further preferred embodiment, the machine has at least one additional manipulating device and/or treatment station, which would not be necessary in order to achieve a required machine output.

The machine advantageously has an additional manipulating device and/or treatment station which is not used in normal operation. In other words, in a possible embodiment, one or more substitute or reserve stations are provided in addition to the stations necessary in order to achieve the machine output. This substitute or reserve station preferably contains a manipulating device and at least one treatment station.

Advantageously this reserve station is not activated in normal operation. The reserve station is preferably activated only in the event of a failure/defect or the need for maintenance of a station, whilst the relevant station is deactivated. The advantage is that thus the production mode can be maintained with 100% output, since the number of producing stations remains constant. Moreover, the stationary station can advantageously undergo maintenance, whilst the rest of the stations continue to produce, which means a considerable increase in the machine performance by comparison with the complete stoppage of the machine (such as would be necessary for example in the case of carousel machines).

In order to obtain uniform wear over all stations, the reserve station can preferably also be displaced dynamically. For example station a pauses for an hour, in the next hour station b pauses, etc. Thus, all stations, considered over a relatively long time period, have approximately the same running time.

In an alternative embodiment the machine likewise has one or several stations more than are actually necessary in order to achieve the required machine output. In other words, also in this embodiment the machine is oversized to a certain extent. For example, in an embodiment in which each station can process 2000 containers per hour (bph) and the required machine output is 40000 bph, the machine cannot be equipped with 20 stations, but with 21. Then in normal operation all 21 stations run at a reduced output of approximately 1905 bph. In the event of failure of a station the output of the remaining 20 stations is increased to 2000 bph. Thus, the machine output can continue to be 40000 bph.

The containers can in particular be beverage containers, plastic containers, parisons, glass containers, cans and the like.

In an advantageous embodiment a movement of the containers in a direction perpendicular to the transport path P of the containers is carried out with the aid of support elements. In this case a movement can preferably be carried out vertically downwards or vertically upwards. In this case the terms "downwards" and "upwards" should preferably be understood in the direction of gravity. This direction advantageously corresponds to a longitudinal direction of the transported containers. This preferably also covers transporting the containers with an opening downwards (with respect to gravity). Accordingly, with such an orientation a movement downwards (with respect to gravity) would signify a movement in the direction of the opening of the containers, that is to say in the direction which is usually designated as "upwards" relative to the container geometry.

In a preferred embodiment a closure element is arranged on the support element. This closure element is advantageously suitable for closing the treatment station in an airtight manner. In particular the closure element is preferably suitable for closing a vacuum chamber of the processing station in an airtight manner.

It is pointed out that this configuration can also be used independently of the embodiment described above. The applicant therefore reserves the right to claim protection for a machine for coating containers with at least one vacuum device for generating a vacuum, with at least one treatment station for coating containers with a plasma, wherein the treatment station is in fluid communication with the vacuum device and wherein the treatment station has at least one treatment device which can be introduced into a container, with a conveyor device for transporting containers on a transport path P and with at least one support element to receive at least one container.

According to the invention the support element is movable in a direction different from zero relative to the transport path P of the containers and is suitable for introducing the container into the treatment station, wherein a closure element is arranged on the support element and the closure element is suitable for closing the treatment station in a substantially airtight manner.

In this case the term "substantially airtight" should be understood to mean that only a small gas exchange can take place. In this case the gas exchange should preferably be so small that it is negligible when evacuation of the processing station takes place.

The terms "can be introduced" or "introduce" should always be understood as relative movement of the respective elements. This includes not only that the elements (for example the processing device and a container) both move towards one another, but also that one of the elements rests whilst only the other one moves. With regard to the movement of only one element, in particular both variants are covered, that is to say both the movement of the 1st element (for example the treatment device) and also of the 2nd element (for example of the container), whilst the respective other element rests.

The support element is suitable for accommodating at least one container and comprises devices designed for this (also referred to below as receiving devices), for example clips or other container receiving devices. Typically, these container receiving devices or clips are arranged so that container treatment can take place with them in the treatment station, and thus they do not impede the container treatment. The cups can be in particular passive, that is to say without external influence they remain in their respective state, i.e. opened or closed, so that they only have to be switched for changing over between the opened and closed state. In particular such passive clips then hold the containers by themselves. In other embodiments actively controlled clips are used, which must be actively held closed and are opened without action, or vice versa, that is to say clips which must be actively held open and are closed without action. The receiving devices can be optionally height-adjustable, so that they can be used for containers of various sizes.

In a preferred embodiment the conveyor device is suitable for moving the containers along a circumferential transport path. Advantageously the containers are moved by the conveyor device on an at least partially curved transport path. The conveyor device preferably has a rotatable support. The conveyor device advantageously comprises a rotatable carousel with retaining means for the containers arranged along a pitch circle at uniform distances relative to one another. The conveyor device is preferably a rotary machine.

The conveyor device can preferably be the described manipulating device. The device described here for coating of containers is therefore particularly preferably used with the device described above for treating containers with at least two manipulating devices.

Advantageously more than one treatment station can be associated with a conveyor device or manipulating device.

In a preferred embodiment the treatment station is arranged below or above the transport path P of the containers. In this case it is also possible that the treatment stations are not arranged immediately below or above the transport path, but laterally offset therefrom. Thus, it would be possible for example that in the case of an at least partially circular transport path the treatment stations are offset radially outwards or also inwards. For example, the treatment stations could be offset radially outwards below the transport path.

The support element is preferably movable in a direction perpendicular to the transport path P of the containers. The movement of the support element for introduction of the container into the treatment station preferably takes place downwards or upwards. Particularly preferably the treatment stations are arranged below the transport path of the containers and the movement of the support element for introduction of the container into the treatment station takes place downwards. The support element is advantageously designed to transport the containers with their opening downwards. The movement of the support element for introduction of the container into the treatment station preferably takes place in the longitudinal direction of the container. Particularly preferably the movement takes place downwards relative to gravity, but upwards relative to the container geometry, that is to say in the direction of the opening of the container.

In this case it is also possible that both a movement downwards or upwards and also a movement in the lateral direction relative to the transport path takes place. This is necessary for example if the treatment stations are offset radially outwards below the transport path. For this purpose, the device advantageously has a lifting and rotating device. This lifting and rotating device is advantageously suitable for removing containers from the conveyor device. The lifting and rotating device preferably removes a container from the conveyor device and pivots it over or under the treatment station. The container is advantageously lowered or lifted by the lifting and rotating device into the treatment station. The lifting and rotating device can advantageously also carry out this sequence of movements in the opposite direction. Thus, the lifting and rotating device is suitable for lifting a container out of the treatment station or lowering the container and pivoting it to the conveyor device. The lifting movement can advantageously be carried out with the aid of a linear motor.

In an advantageous embodiment the closure element is arranged rigidly on the support element. The closure element is advantageously arranged immovably on the support element in a longitudinal direction of a container. Advantageously through a fixed arrangement of the closure element on the support element it is ensured that a movement of the support element leads to an equal movement of the closure element. As a result, in particular it is ensured that in the event of an upward or downward movement of the support element the closure element is moved up or down over the same distance. In this way a movement of the support element in the direction of the treatment station can lead to the closure element moved at the same time therewith being applied in a sealing manner to the treatment station.

In a preferred embodiment me device has at least one sealing element. This sealing element is advantageously arranged between the treatment station and the closure element. Each treatment station or each closure element preferably has at least one sealing element Advantageously the sealing elements can nave any profiles and have a resilient material on their sealing surfaces. The resilient material may be in particular rubber, silicone or the like.

In a preferred embodiment the vacuum device is suitable for generating a negative pressure of less than 100 mbars in the treatment station, preferably less than 10 mbars and particularly preferably less than 1 mbar. Particularly preferably a pressure range from 0.1-1 mbar is set by the vacuum device.

In a preferred embodiment the treatment device is arranged immovably in the treatment station. Advantageously in the introducing movement of the treatment device into the container only the container moves, whilst the treatment device advantageously rests.

The treatment device is advantageously an elongated rod-shaped element, in particular a lance. The treatment device preferably has openings. Through these openings a flowable medium can preferably be introduced into the containers. This flowable medium is preferably a gas suitable for the plasma process. This gas can advantageously be a mixture of a silicon-containing precursor and oxygen, in particular for a PECVD (=plasma enhanced chemical vapour deposition) with silicon oxide. However, other gases are also conceivable, for example acetylene for the deposition of so-called DLC coatings. For a plasma sterilisation for example argon and water vapour can be introduced into the containers.

This gas is advantageously homogeneously distributed in the interior of the bottle.

Advantageously the treatment device serves as electrode for the plasma generation. The energy which should ignite the plasma can then be coupled into the system in the form of high frequency by means of this treatment device.

The processing station preferably has a second electrode. This electrode can be advantageously located outside the container, but advantageously also inside the container. This second electrode can advantageously be earthed or advantageously connected in a floating manner to the first electrode.

In an alternative preferred embodiment, it is possible to dispense with the treatment device serving as electrode for the plasma generation. Advantageously such an embodiment has a device for generating an electromagnetic field. Advantageously the device is suitable for generating an electromagnetic field which is suitable for igniting a plasma in the introduced gas. This generated electromagnetic field can be for example a high-frequency field, but also for example a microwave. This device is advantageously located outside the container. Thus, the electromagnetic field is preferably irradiated from outside the container into the container.

In an advantageous embodiment the treatment station has a valve by which the treatment station can be ventilated, in particular after the ending of the plasma process.

Furthermore, the present invention is directed to a method for treating containers, in which a transport device transports the containers and in which a manipulating device picks up a pre-defined plurality of containers from the transport device in a transfer region, moves on a transport path and delivers containers to the transport device or a further transport device in a delivery region, wherein at least one further manipulating device picks up a pre-defined plurality of containers from the transport device in a further transfer region, moves on a transport path and delivers containers to the transport device or a further transport device in a further delivery region, wherein the manipulating devices transport the containers on the transport path in each case to at least one treatment station associated with the manipulating device.

According to the invention the transport speed of the manipulating devices is controlled in such a way that the transport speed of the manipulating devices during the transfer and/or delivery of the containers is synchronised with the transport speed of the transport device and/or the further transport device, and the transport speed of the manipulating device is reduced after the transfer of the containers.

In this case the machine described above is in particular configured and provided in order to carry out this described method, i.e. all the features set out for the described device are likewise disclosed for the method described here, and vice versa.

A preferred sequence appears for example as follows: The manipulating device is located at the start in a rest position. As soon as the containers to be treated by it approach the transport device, the movement of the manipulating device starts. This is advantageously a rotational movement. The manipulating device takes a defined number of containers from the transport device and ends the rotation at the treatment stations. Advantageously the containers are moved exactly so far that each container is associated with a treatment station. In this case the term "associated" should be understood to mean that the container is located in the immediate spatial proximity of a treatment station, that is to say for example directly above it, below it or alongside it. Advantageously the manipulating device introduces the containers into the treatment station and/or the treatment stations pick up the containers from the manipulating device.

After completion of the treatment a movement can take place in order to bring the containers out of the treatment station. However, such a movement does not have to be absolutely necessary. For example, such a movement at a filling valve is not necessary, if the container only has to be held below a discharge opening. Then the rotary movement starts in order to deliver the treated containers to the transport device and to receive new untreated containers from the transport device. The cycle now begins again.

For functioning of this system, it is very important to fix the cycle order of the manipulating devices appropriately. Otherwise it can happen that a manipulating device is intended to transfer a finally treated container to the discharge, but this is not possible since the appropriate location is already occupied by another container which has previously been delivered. A loss of time and thus a reduction in the machine output are linked to this.

In order to avoid this, a suitable pattern must be selected according to which the manipulating devices are switched. The advantageous requirement of a suitable pattern is: All the containers must be removed by the transport device at the end of the infeed path—that is to say at the latest at the last manipulating device.

The switching sequence of the individual manipulating devices is preferably selected so that they are distributed as uniformly as possible in use. Ideally there is always the same time interval between the clockings.

In a preferred method the containers on the transport device and/or a further transport device are moved at constant speed. A continuously running stream of containers advantageously runs into and out of the machine, whilst only the treatment takes place in a clocked/stationary manner. This has the advantage that although a clocked treatment of containers is made possible, in this case nevertheless a problem-free integration into a (continuously running) production line is possible.

The containers are advantageously transferred to the manipulating devices from the infeed preferably running at constant speed or delivered into the discharge preferably running at constant speed.

However, it is also conceivable that the speed of the transport device varies, for example in order to compensate for gaps in the stream of containers or to deliver the containers at a specific pitch. A possible pitch can preferably be produced either already before the device, in a feed starwheel or in the transport device.

However, the transport speed is preferably constant starting from the first transfer region, that is to say starting from the transfer region which is located furthest upstream, since starting from here the manipulating devices begin with the container removal. However, it is also conceivable that the speed is also varied on this path. In particular, acceleration phases for saving time can be introduced. Advantageously these acceleration phases are situated between the transfer regions, so that the containers are not subject to any accelerations in the transfer region. The speed of the containers in each of the transfer regions is preferably identical.

In an advantageous method the speed of the manipulating devices is reduced to a standstill. The treatment stations advantageously treat the containers while at a standstill. The movement, in particular rotation, of the manipulating device is preferably stopped when the container or the containers from the stream of containers have been removed from the transport device (infeed) and taken out of the collision region with the subsequent containers. In this case the term "collision region" should be understood to be the region in which subsequent containers, which are transported further by the transport device, can at least come into contact with containers which are located in the manipulating device.

In special cases it may also be expedient not to retard the (rotational) movement of the manipulating device completely to a standstill, but instead to move past the treatment station at a reduced speed.

After the end of the treatment operation the manipulating device is set in motion again and synchronised with the discharge part of the transport device. This may be either the discharge part of the original transport device or of a further transport device. At the delivery point the container or the containers are then delivered to the transport device. The treated containers leave the device by means of the transport device.

In an advantageous method, not every transport unit transports a container to the transport device, Preferably on the transport device only every nth transport unit is occupied. In this case this applies particularly preferably to every second transport unit. Thus one (or possibly also a plurality of) empty transport units is located between each occupied transport unit. The transport units can be in particular neck handling clips.

Because only every nth transport unit is occupied, on the one hand the path speed increases, which enables a faster transfer, and on the other hand it allows a container transfer and delivery at only one point.

If in the transport device for example only every second clip is occupied, this results in a double path speed with the same machine output. Therefore, receiving and delivery of the containers by the manipulating devices can take place more quickly. Since the rotational speed is raised, therefore the time required for one rotation decreases. In this way a higher machine output is possible.

This method is preferably carried out in an embodiment in which the delivery region of a manipulating device corresponds spatially to the transfer region of a manipulating device.

Advantageously the transport units which transport the containers before a transfer of the containers to the manipulating devices, are transport units which are different from the transport units which transport the containers after a delivery of the containers by the manipulating devices.

Thus, during a container transfer, a container is alternately received and delivered at the transfer or delivery points between the manipulating devices and the transport device. Therefore, each manipulating device has to rotate only once, in order to deliver its treated containers and to receive new containers.

Alternatively, allowing for a longer transport time it would also be conceivable that each manipulating device performs a rotation, during which it delivers the treated containers and then performs a further rotation in order to receive the new container. However, as a result the effectiveness of the manipulating device is reduced, since the transport time is longer by comparison with the treatment time.

Due to the occupancy of only every nth transport unit and the simultaneous transfer and delivery of containers at the transfer point to the manipulating devices, the manipulating devices must preferably have more manipulating units than treatment stations. Advantageously the manipulating devices have n times as many manipulating units as treatment stations, preferably twice as many.

In each cycle the containers are picked up alternately by different manipulating units of a manipulating device. If the manipulating units of a manipulating device were to be numbered consecutively, for example in a first cycle the even numbered manipulating units would be occupied by containers, and on the other hand in a second cycle the odd numbered manipulating units would be occupied, in a third cycle the even numbered manipulating units would be occupied, etc.

However, since the treatment stations are placed stationary in the device the manipulating device can preferably assume a plurality of, preferably two, rest positions. The rest positions are preferably approached alternately with the cycles. Advantageously in each cycle the rotary movement of the manipulating devices comes to a standstill, so that the containers are located in immediate spatial proximity to the treatment stations. In the specific application, in which every second transport unit and every second manipulating unit is occupied, the manipulating devices have two positions which are approached alternately with each cycle in order to be able to introduce the containers into the treatment stations.

In this case one of the manipulating devices has one manipulating unit less than the rest of the manipulating devices. This is advantageously, so that also in the discharge of the transport device a continuous stream of containers is produced with alternating full-empty occupancy. With each cycle, the treated containers are advantageously inserted into the transport device alternately before and after the untreated containers. In order to balance this alternation advantageously a manipulating device with a reduced manipulating unit is necessary.

In an advantageous method after completion of the treatment operation the containers are immediately transported by the manipulating device associated with this treatment station to the delivery region. The switching operations of the manipulating devices and the transport device are preferably co-ordinated with one another so that after completion of the treatment operation each manipulating device can immediately deliver its treated containers to the transport device and can receive new containers so that no unnecessary waiting times ensue.

After completion of treating the containers are advantageously transferred again without time lag to the transport device, so that at the discharge of the machine an uninterrupted stream of containers runs out of the machine. Advantageously the stream of containers merely has gaps in the discharge from the machine, if the infeed already has gaps. Even if the infeed already has gaps, however, it is conceivable that these gaps in the stream of containers are compensated for to a certain extent. The use of a long stator linear motor as transport device may be considered for example for this purpose.

It would also be possible to integrate a discharge of "bad containers". Preferably in the case of containers to be discharged these are not picked up by a manipulating device, but are transported to the end of the infeed path. At this point the containers can then be removed.

In a preferred method the containers are fed to the machine in the same sequence in which they leave it.

Preferably the distance between the individual containers and/or between batches, consisting of a plurality of containers, can be changed. With a low output the distance between the batches can advantageously be increased.

In an advantageous method the manipulating device can carry out a lifting movement in addition to the transport movement. A manipulating device preferably contains a starwheel/a carousel which can carry out a rotating and lifting movement. Both movements occur in a cyclical manner.

Such a lifting movement is advantageous for example in the case of a container coating machine or a sterilising device. In a container coating machine empty (plastic) containers are provided with a coating on the inner side in order to reduce the gas permeability.

Advantageously by a lifting movement a container is immersed in a vacuum chamber of the treatment station in which the coating process is carried out.

In the case of a container interior coating a preferred method is as follows: When the container or the containers have been removed from the stream of containers (infeed) and taken out of the collision region with the subsequent containers, the rotation of the manipulating device is stopped. Subsequently, a lifting movement (lifting or lowering as required, depending upon whether the treatment station is located below or above the manipulating device) is carried out, in order to feed the containers to be coated into the treatment chamber. Now the coating process is carried out. Then the coated containers are lifted or lowered again out of the chamber. In this case it is also conceivable that the lifting or lowering movement does not follow the rotational movement but begins slightly overlapped by it.

In the case of a container interior coating the manipulating device preferably removes the untreated containers from the transport device and brings them into one or more vacuum chambers, in which the actual coating process takes piece, since this must be carried out under specific environmental conditions, for example in a vacuum. Advantageously the vacuum chamber is evacuated after introduction of the container. An exemplary sequence of the process steps could be as follows:

0.5 seconds: introduction of the container into the chamber (for example by lowering)
2 seconds: evacuation of the chamber:
5 seconds: coating process
1 second: ventilation
1.5 seconds: moving the container out of the chamber and delivery of the coated container and providing the station with new containers, The duration of a cycle in this example is approximately 10 seconds. It can be easily seen that the vacuum pump is only required in 20% of the time (2 out of 10 seconds). The rest of time it is inactive.

This can advantageously be avoided by one vacuum pump being shared by a plurality of manipulating devices. However, this necessitates a correspondingly favourable dock sequence of the manipulating devices. Thus, it would be bad for example if the manipulating device a begins the cycle at the time 0 s, and the manipulating device b, which shares a vacuum pump with the manipulating device a, begins the cycle at the time 1 s. At the time 1 s the manipulating device a is not yet completely evacuated. If now at 1 s the manipulating device b is switched to the vacuum pump, the vacuum in the manipulating device a is reduced again, i.e. the pressure rises. In this way no reliable evaluation process can take place.

Therefore, the switching sequence of the manipulating devices is advantageously chosen so that the stations do not require the vacuum simultaneously/overlapping, but with a suitable time gap. Thus, the switching sequence and the switching times should preferably be selected so that the vacuum pump(s) are utilised as uniformly as possible.

The most uniform utilisation possible of the vacuum pump(s) is advantageously achieved by means of a corresponding choice of the geometric ratios and switching sequence of the manipulating devices as a function of the machine output (container throughput per hour), the container pitch (spacing of the containers on the transport device), the number of manipulating devices in the machine and the number of different docks.

Moreover, regardless of the described method the invention is directed to a method for coating containers, in which the container is transported with the aid of a conveyor device along a transport path P, is introduced into a treatment station with the aid of a support element in a direction different from zero relative to the transport path P, and a treatment device is introduced into the container, wherein the treatment station is evacuated in a subsequent step and the container is coated with a plasma.

According to the invention a closure element arranged on the support element is moved towards the treatment station and the closure element doses the treatment station in a substantially airtight manner.

It is pointed out that this method can also be used independently of the method described above. The applicant reserves the right also to claim protection for such embodiments.

In this case the machine described above for coating containers is in particular configured and provided in order to carry out this described method, i.e. all the features set out for the described machine for processing containers are likewise disclosed for the method described here, and vice versa.

Advantageously the closure element is moved towards the treatment station due to the movement of the support element.

The container is advantageously coated in particular on an inner face with plasma. For this purpose, a gas is advantageously introduced into the interior of the container by means of a treatment device. A gas suitable for the plasma process is preferably introduced into the bottle and distributed as homogeneously as possible in the interior of the bottle. The gas introduced into the interior of the container is preferably ignited, so that a plasma is produced. For this purpose, for example an electrode can be introduced into the container. The energy which should ignite the plasma can then be coupled into the system in the form of high frequency by means of this electrode.

Whilst the container is undergoing the plasma treatment, the ensuing waste gas is advantageously permanently pumped out. After the end of the plasma process the treatment station is advantageously ventilated by means of a valve.

In a preferred method, after the end of the coating process the container is led out of the treatment station with the aid of the support element. With the aid of the support element the container is advantageously lowered into the treatment station for treatment and after the treatment it is lifted out of the treatment station.

In an advantageous method two vacuum pumps are used for the evacuation. The first pump advantageously evacuates the vacuum chamber to a first pressure level. The second vacuum pump evacuates the vacuum chamber preferably to a second pressure level, which is below the first pressure level. The second pressure level advantageously corresponds to the pressure level at which the actual coating process takes place. In this way the necessary evacuation time is advantageously divided successively over two pumps. Thus, in the illustrated example each pump preferably evacuates for only approximately 1 second.

Further advantages and embodiments are disclosed by the appended drawings.

BRIEF DESCRIPTION OF THE DRAWING

In the drawings:

FIG. 13b shows a table with a favourable switching sequence for the example shown in FIG. 13a;

FIG. 14b shows a table with a favourable switching sequence for the example shown in FIG. 14a;

FIG. 15b shows a table with a favourable switching sequence for the example shown in FIG. 15a;

Figure 1:
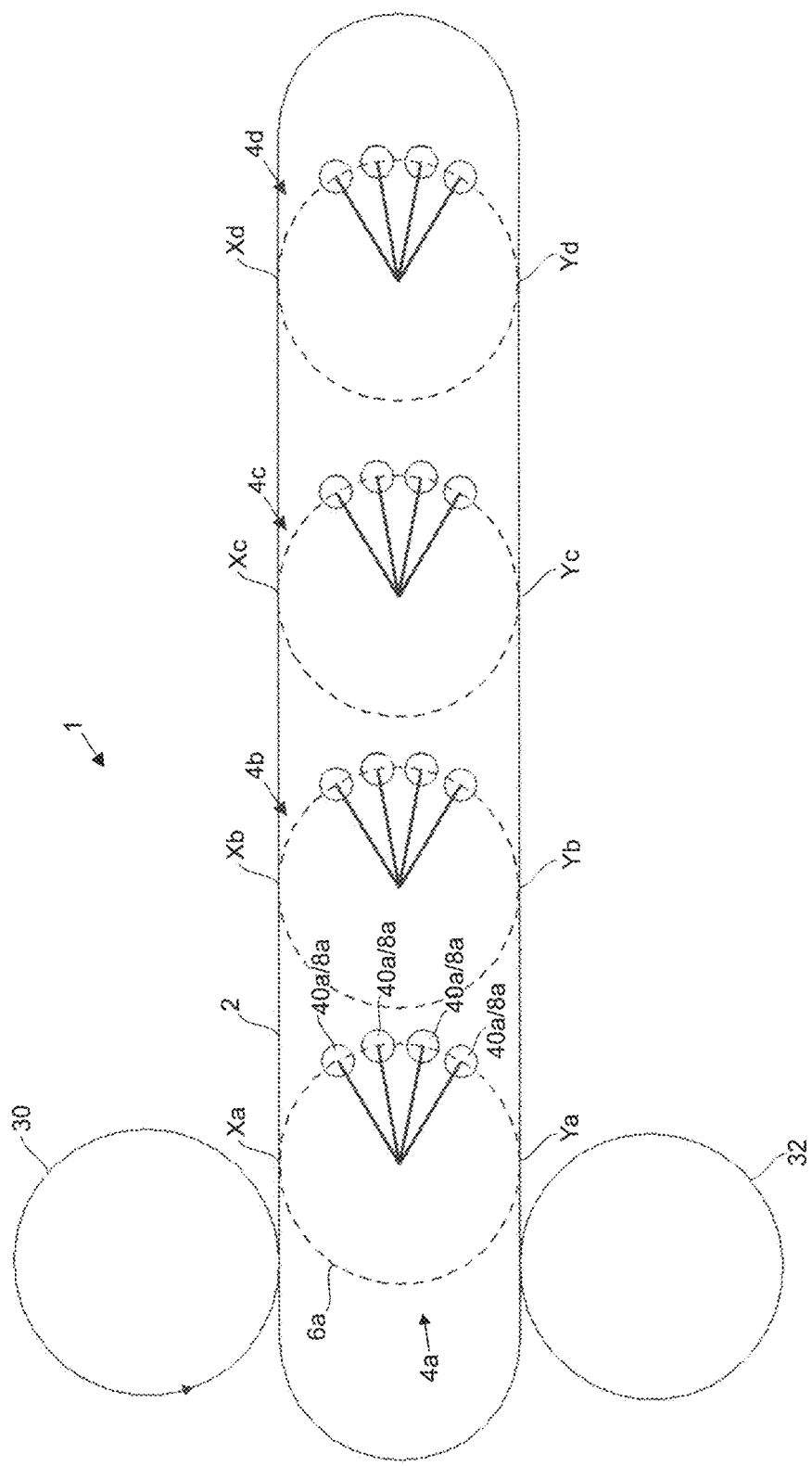
FIG. 1 shows a schematic representation of an exemplary embodiment of a device according to the invention.

For elements of the invention which are the same or equivalent in each case identical references are used. Furthermore, for the sake of clarity only references which are necessary for the description of the respective drawings are used in the individual drawings. The embodiments illustrated in the drawings merely constitute examples of how the machine according to the invention and the method according to the invention can be configured and do not constitute any definitive limitation of the invention or the inventive idea.

DETAILED DESCRIPTION OF THE INVENTION

FIG. 1 shows a schematic representation of an exemplary embodiment of a device 1 according to the invention. In the drawing a transport device 2 can be seen which can transport containers 10 (not shown). The containers are delivered from the feed starwheel 30 to the transport device 2. The device 1 has a plurality of manipulating devices 4. The manipulating devices are provided with additional references a-d for better differentiation. Thus, the reference 4a relates to the manipulating device which is closest to the feed starwheel, so that it is located furthest upstream. 4b designates the subsequent manipulating device, 4c designates the third manipulating device and 4d designates the fourth and last manipulating device. Thus, whilst the reference 4 with the addition of a letter designates a specific manipulating device, the reference 4 relates generally to the manipulating devices, without differentiation between the specific manipulating devices. The same applies to further references which are used partially with and partially without the addition of letters.

Each manipulating device has a rotatable support 6. For reasons of clarity only the support of the manipulating device 4a has been provided with the reference 6a. Moreover, each manipulating device 4 has a plurality of, in this case four, manipulating units 40, each of which is suitable for receiving a container 10. Here too, for reasons of clarity only the manipulating units 40a of the manipulating device 4a have been provided with a reference.

In FIG. 1 the manipulating devices 4 are located in a position in which the manipulating units 40 are located in in each case in the immediate proximity of (for example above) the stationary processing stations 8 of the respective manipulating devices. Thus, for example the manipulating device 4a has four processing stations 8a, which are located immediately below the manipulating units 40a and are not shown separately.

Moreover, each manipulating device 4 has a transfer region X and a delivery region Y. In the transfer region X containers 10 can be transferred from the transport unit 2 to the manipulating devices 4. In the delivery region Y containers 10 can be delivered by the manipulating devices to the transport device 2.

Thus, in a method according to the invention four containers 10 are transferred to the manipulating devices 4a in the transfer region Xa. Containers following these containers 10 are transported further by the transport device 2—preferably at a continuous speed. Containers are also transferred to the manipulating devices 4b, 4c and 4d in each case in the transfer regions Xb, Xc and Xd. In this case it is indeed possible, but not obligatory, that the containers are transferred to the manipulating devices in ascending order. It is also conceivable that for example first of all containers are transferred to the manipulating device 4b, then to 4d, then 4c and only finally to 4a. It is also possible that containers are transferred simultaneously to a plurality of manipulating devices 4. Advantageously, however, the clock sequence is always the same, i.e. the sequence in which containers are transferred to the manipulating devices preferably remains the same. In order to ensure processing of all containers, the dock sequence must be selected so that the containers are transferred at the latest to the last manipulating device (in this case 4d). Accordingly, with the curvature on the right-hand side of FIG. 1 the transport device 2 should preferably contain no containers.

After the containers 10 have been transferred to a manipulating device 4, they are transported with the aid of the support 6 which is rotatable in a clockwise direction to the treatment stations 8 and are treated there. After the treatment, the containers 10 are further transported from the manipulating device 4 to the delivery point Y and are delivered there to the transport device 2. Advantageously the treatment in the treatment stations 8a-d in each case lasts for the same length of time. Accordingly, the containers 10, which have been transferred at an earlier time to a manipulating device 4, are also delivered at an earlier time than the containers which were transferred at a later time.

Figure 2:
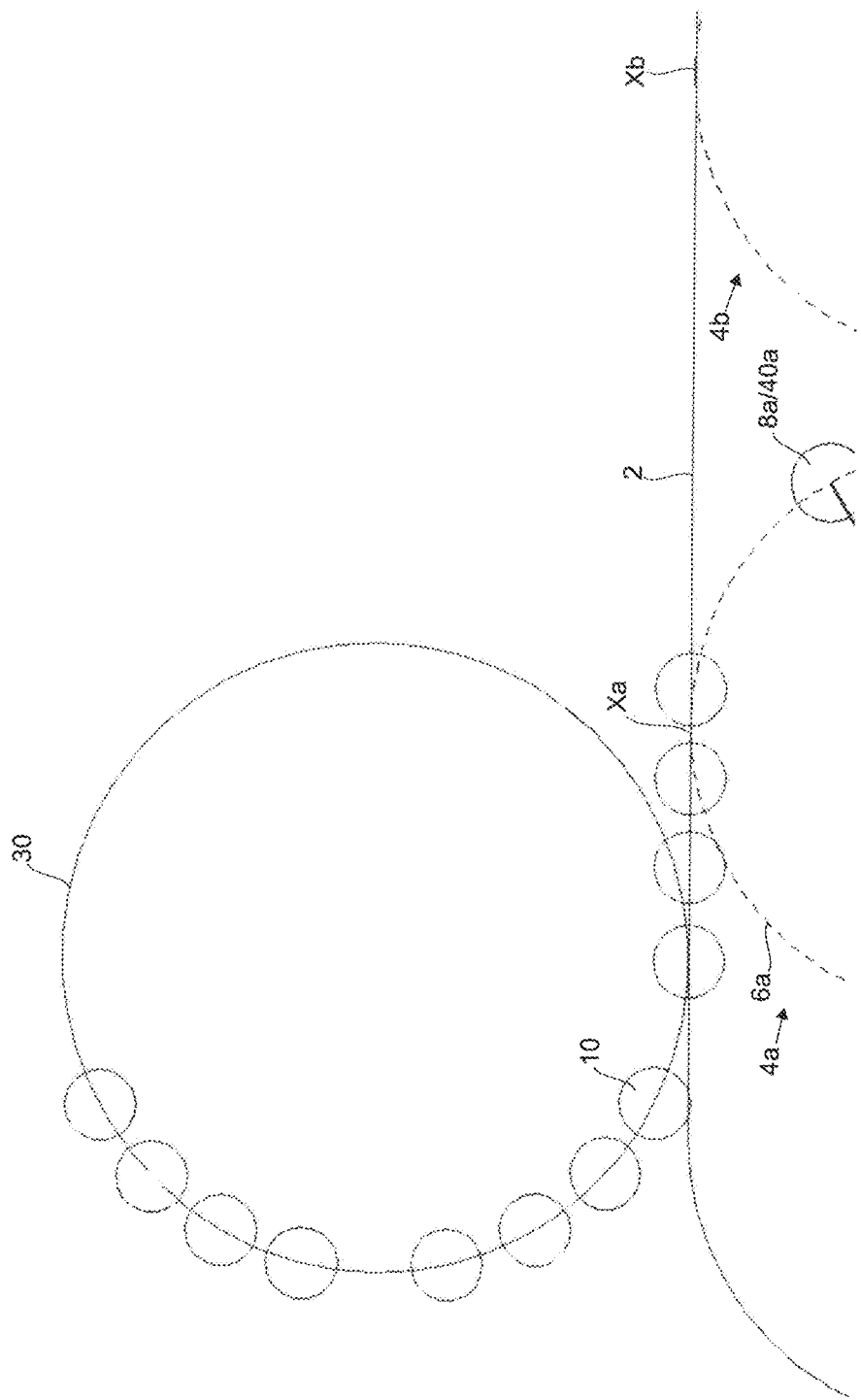
FIG. 2 shows an enlarged representation of the transfer region.

FIG. 2 shows an enlarged detail of the inlet starwheel 30 and the transfer regions Xa and Xb. Moreover, a detail of the transport device 2 can be seen. Containers 10 are transferred from the feed starwheel 30 to the transport device 2. The containers 10 are combined in each case into groups (batches) of four containers 10. In this exemplary embodiment the stream of containers has a gap after every four containers. The manipulating devices 4a and 4b can be seen in part at the lower edge of the drawing. In the case of the manipulating devices 4a and 4b the transfer region Xa or Xb respectively can also be seen. In FIG. 2 the first container batch is currently moved away to just above the transfer region Xa. These containers are not picked up by the manipulating device 4a, but are transported further by the transport device 2. Instead (not shown) these containers are transferred to one of the following manipulating devices at a later time. In the lower region of FIG. 2 a manipulating unit 40a can also be seen at the position of a treatment station 8a.

Figure 3:
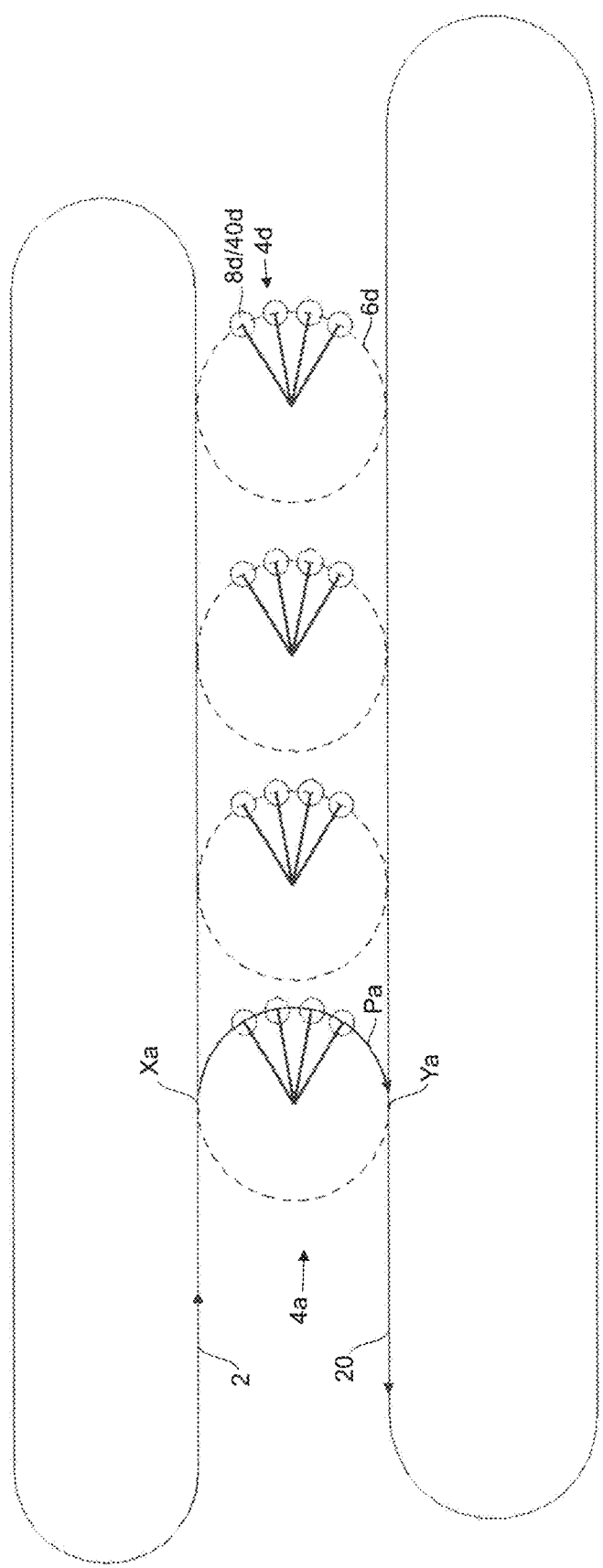
FIG. 3 shows a schematic representation of an exemplary embodiment of a device according to the invention.

FIG. 3 shows a schematic representation of an alternative device according to the invention. In contrast to the device 2 shown in FIG. 1 and FIG. 2, this alternative machine has transport devices 2 or 20. The transport devices 2 or 20 are configured as a transport oval and are arranged parallel to one another. The manipulating devices 4 are arranged between the transport devices 2 and 20. The untreated containers (not shown) are moved on the transport device 2 from left to right (anticlockwise). As described with regard to FIG. 1, the containers (also in this example in groups of four containers in each case) are transferred to the manipulating device 4. Containers which are not picked up by a specific manipulating device 4a-c are transported past this manipulating device by the transport device 2. In order to ensure treatment of all containers, the clock sequence must be selected so that the containers are transferred at the latest to the last manipulating device (in this case 4d). Thus, no containers should be transported past the manipulating device 4d over the curvature of the transport device 2 on the right-hand side and back again to the left-hand side. (Exception: It would be conceivable at this point to integrate a discharge conduit for "bad containers". In this case containers which do not meet the quality requirements would not be picked up by any manipulating device from the transport device 2, but would be transported further on the transport device 2 and are removed from the transport device 2 at a suitable location (for example in the upper part of the transfer system running from right to left).

Also, in the example shown in FIG. 3 the manipulating devices 4 rotate in a clockwise direction on the transport path P. For reasons of clarity, in the manipulating device 4a only the transport path Pa, the transfer region Xa and the delivery region Ya have been provided with a reference. Each manipulating device 4 again has a movable support 6, a plurality of manipulating units 40 and treatment stations 8. Also, in FIG. 3 all manipulating devices are located in a rest position, in which the manipulating units 40 are placed at the treatment stations 8 (not shown in greater detail). For reasons of clarity not all references have been shown here.

After the treatment the containers 10 are delivered to a further transport device 20 at the delivery points Y. This transport device preferably likewise moves anticlockwise. Thus, the containers delivered on the upper parallel region of the transport device 20 are transported from right to left.

Figure 4:
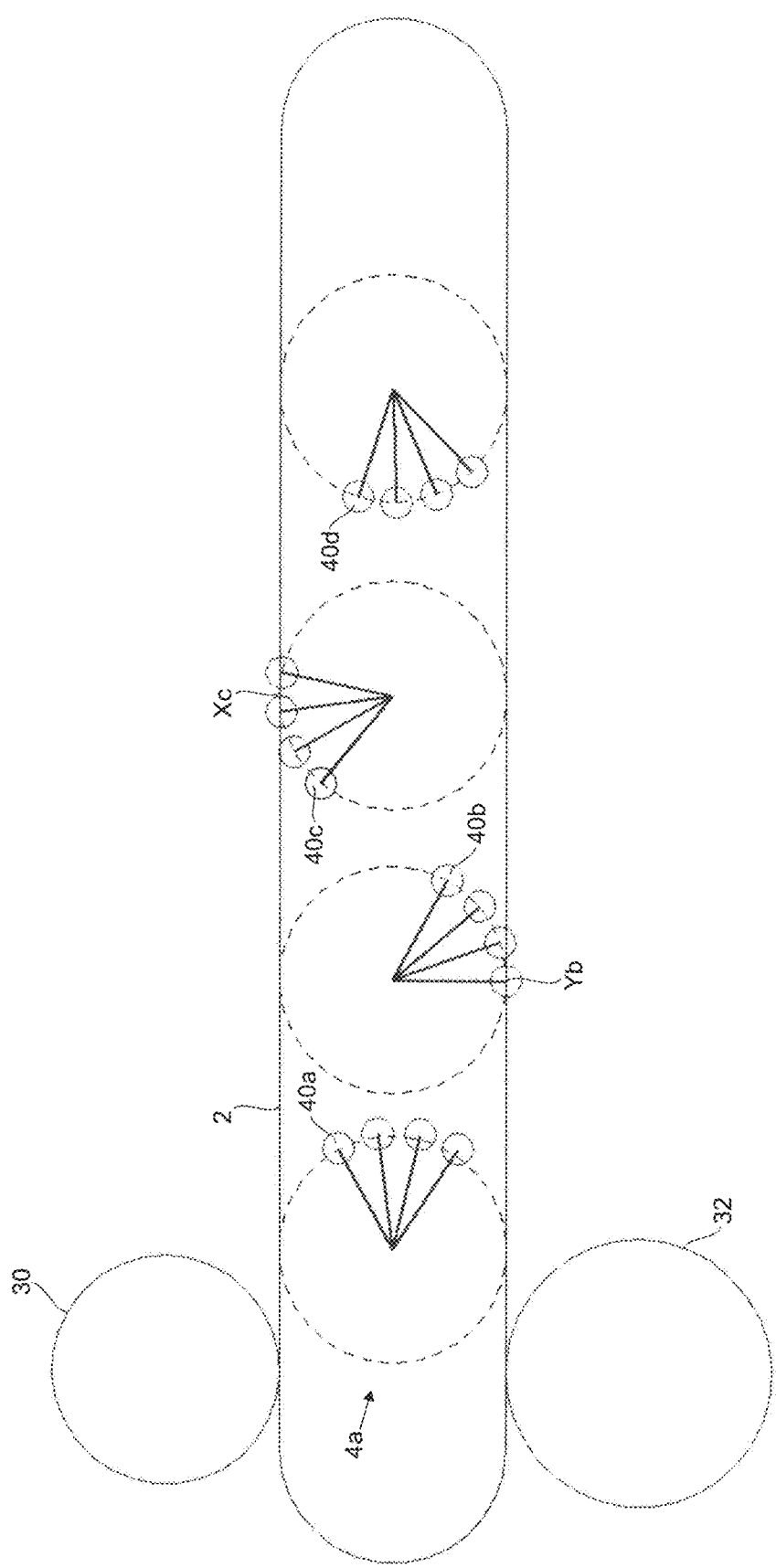
FIG. 4 shows a schematic representation of an exemplary embodiment of a device according to the invention while the method according to the invention is being carried out.

FIG. 4 shows an exemplary embodiment of a device according to the invention while the method according to the invention is being carried out. The device corresponds substantially to the device as already described in connection with FIG. 1. In contrast to FIG. 1, however, it can be seen that all manipulating devices 4 are no longer located in the rest position in the case of the treatment stations 8.

In the manipulating device 4a the manipulating units 40a are located directly at the treatment stations 8a. The containers 10 (transported by the manipulating units 40a, but not shown separately) associated with the manipulating device 4a are treated by the treatment stations 8 at the time shown in FIG. 4. Advantageously the speed of the manipulating device 4a at this time is fully decelerated.

On the other hand, in the manipulating device 4b the first manipulating unit 40b is located at the delivery point Yb. Thus, the manipulating device 4b delivers the already treated containers 10 to the transport device 2. Advantageously the speed of the manipulating device 4b at this time is synchronised with the speed of the transport device 2. At the time shown by FIG. 4 a container is delivered into a free transport unit 22 by the first manipulating unit 40b. The manipulating device 4b and the transport device 2 preferably move at such a speed that the next treated container in the second manipulating unit 40b can be delivered to the next free transport unit 22.

The manipulating device 4d rotates further in a clockwise direction at the time shown in FIG. 4. At this time the manipulating device 4d has already delivered all treated containers, so that the manipulating units 40d are empty and do not carry any containers. At this point the speed of the manipulating device 4d can be selected relatively arbitrarily. Thus, it is possible for example that the speed is constant, and the speeds of the manipulating device 4d and the transport device 2 in this region remain synchronised. This simplifies the necessary control. However, it is also conceivable that the manipulating device 4d is accelerated in this region. This may be expedient for example for reasons of saving time. It is also conceivable that the speed in this region is reduced, for example in order to be able to maintain a required clock order.

On the other hand, in the case of the manipulating device 4c the manipulating units 40c are located in the transfer region Xc. The first manipulating unit 40c has already moved past the transfer region Xc and has received an untreated container. The second manipulating unit 40c is located immediately in front of the transfer region Xc and is there just before an untreated container is received. The speeds of the transport device 2 and the manipulating device 4c are preferably synchronised at this time. Preferably in each case the container in the next transport unit 22 is transferred onto the next manipulating unit 40c.

Figure 5:
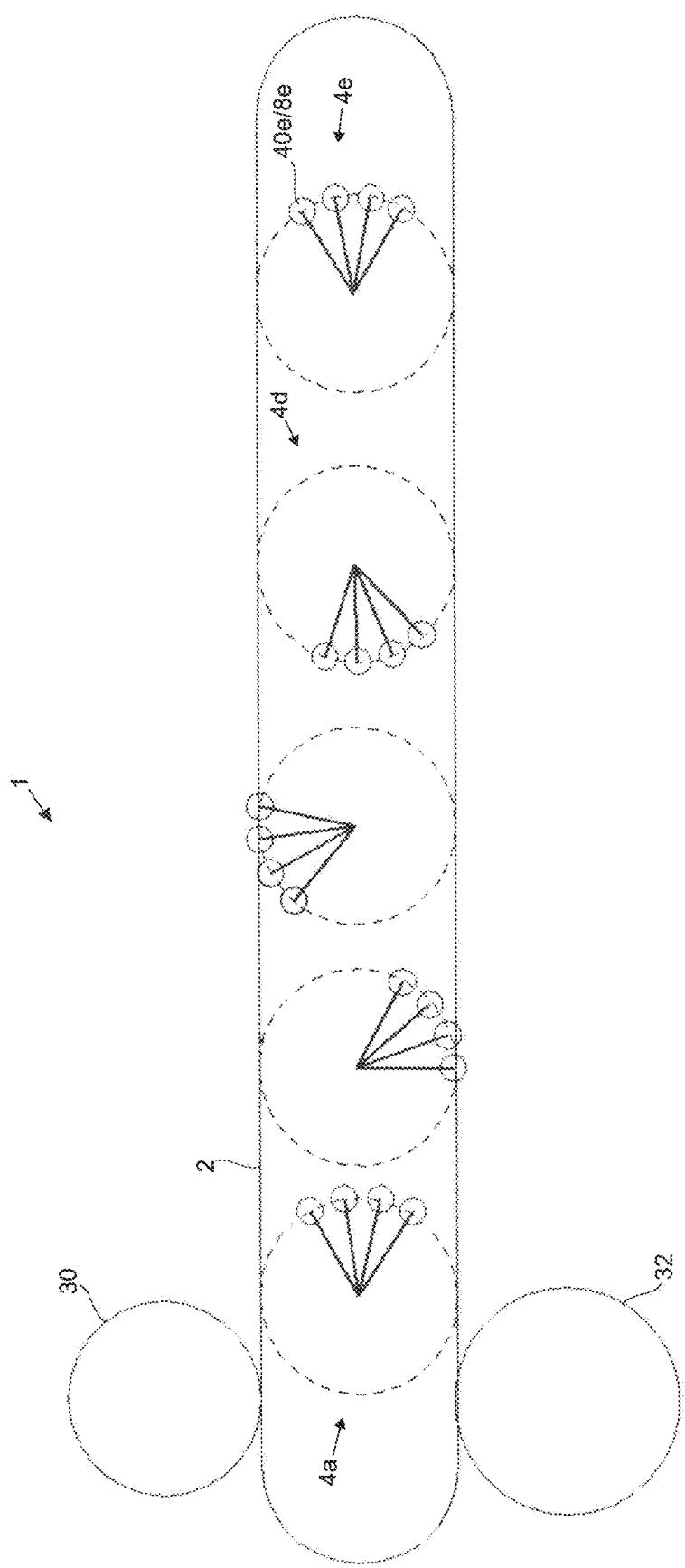
FIG. 5 shows a schematic representation of an exemplary embodiment of a device according to the invention with a reserve station.

FIG. 5 shows an exemplary embodiment of a device according to the invention with a reserve station. The drawing corresponds substantially to the representation in FIG. 4. Also, in FIG. 5 the manipulating devices 4a-4d are located in similar positions to those in FIG. 4. In addition, however, the device 1 in FIG. 5 has a reserve station. This reserve station consists in particular of a manipulating device 4e with manipulating units 40e. Moreover, treatment stations 8e, which are located stationary below the manipulating units 40e and are not shown separately in FIG. 5, are associated with the manipulating device 4e. In this exemplary embodiment the containers are transferred to the manipulating device 4e only when one of the manipulating devices 4a-d cannot be used, for example because there is a defect or maintenance is necessary.

Figure 6:
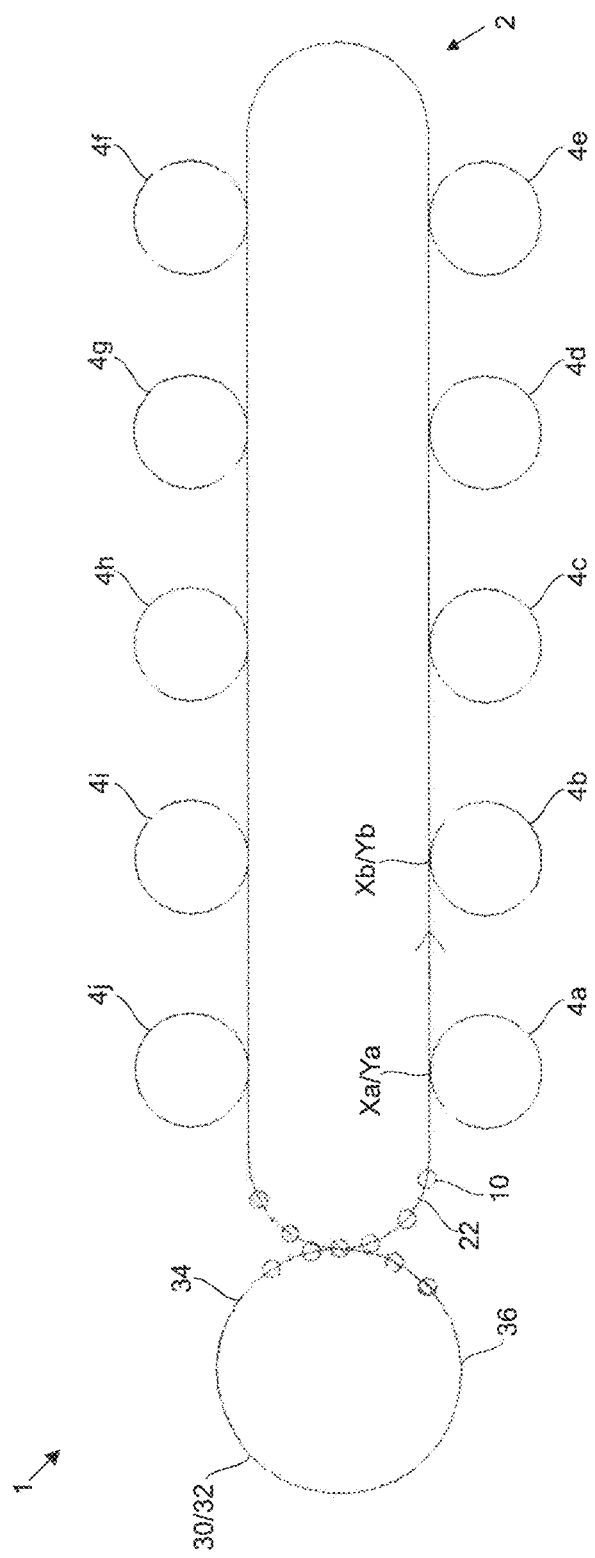
FIG. 6 shows a schematic representation of an exemplary embodiment of a device according to the invention, in which the transfer and delivery regions correspond spatially.

FIG. 6 shows an exemplary embodiment in which the transfer region and the delivery region correspond spatially. Here the device 1 has a feed starwheel 30 which can simultaneously act as the discharge starwheel 32. In this example the starwheel rotates in a clockwise direction. Untreated containers 10 are fed by means of the infeed 34 (upper region of the starwheel) to the transport device 2. Both on the respective feed starwheel or discharge starwheel and also on the transport device 2 only every second transport unit 22 is occupied. Empty transport units 22 in the transfer region are designated symbolically by a small dash, whilst occupied transport units are designated by a circle. This occupancy pattern continues, although the marking is not continued for reasons of clarity.

The containers 10 are transported anticlockwise by the transport device 2. At the transfer regions X containers can be transferred to manipulating devices 4. In this case the manipulating devices 4 are arranged externally around the transport device 2. Containers which are not picked up by the manipulating device 4a are transported further by the transport device 2, etc., and containers which have been transferred to a manipulating device 4 are transported by the manipulating device 4 to stationary treatment stations 8 (not shown). After the containers have been treated, they are transported further by the manipulating device 4 to the delivery region Y (corresponding to the transfer region X). In the delivery region Y the containers 10 (now treated) are delivered again to the transport device 2. The treated containers 10 (shown cross-hatched) leave the transport device 2 and are transferred to the discharge starwheel 30/32 (discharge 36).

Figure 7:
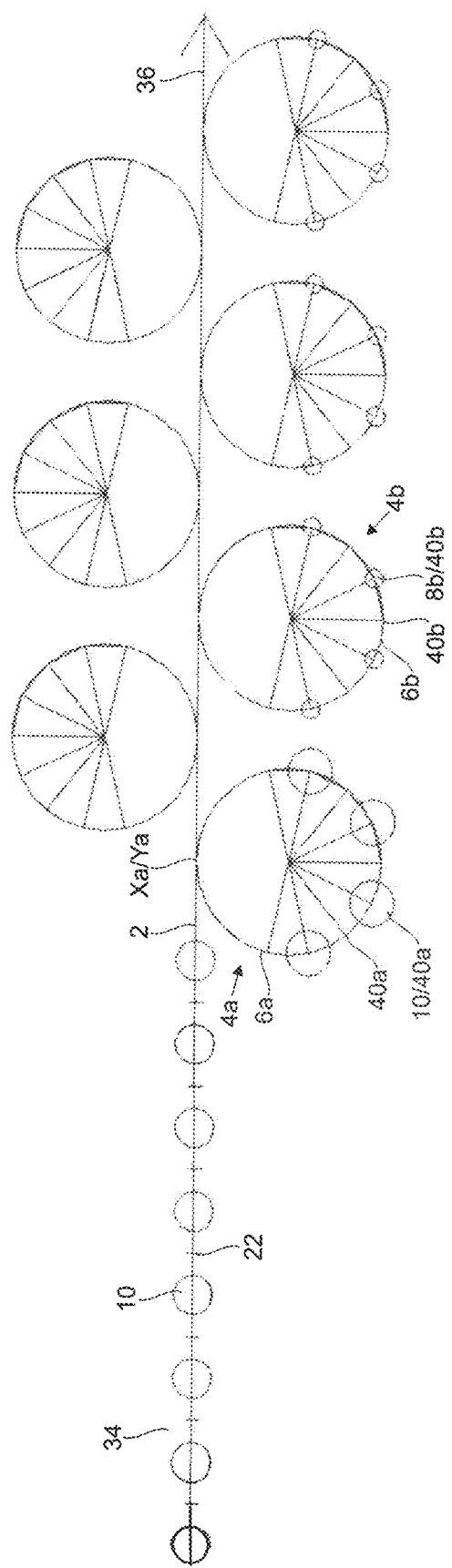
FIG. 7 shows a schematic representation of an exemplary embodiment of a device according to the invention with a linear transport device.

FIG. 7 shows an alternative arrangement. In this case the transport unit 2 is designed not to be oval, but linear. On the left-hand side of the drawing the infeed 34 is located, on the right-hand side the discharge 36. Here too, only every second transport unit 22 is occupied by a container 10. The manipulating devices 4 are arranged to the side of the linear transport unit 2.

For example, it is shown that the manipulating device 4a has a rotatable support 6a and the transfer region Xa corresponds to the delivery region Ya. The manipulating device 4a has a plurality of manipulating units 40a (radial lines). Every second manipulating unit 40a is occupied by a container 10 (large circle). In FIG. 7 the other manipulating units 40a are empty. In the case of the manipulating device 4b, which is likewise marked by way of example, a plurality of manipulating units 40b are likewise present. Here all manipulating units 40b are shown unoccupied. However, the treatment stations 8b (for example located below) can be seen (identified by a small circle). In this case it can be seen that the stationary stations are arranged only below every second manipulating unit 40b. The position of the containers 10 located in the manipulating device 4a corresponds to the position of the treatment stations.

In other words, after receiving containers 10 the manipulating devices 4 rotate exactly so far that the containers 10 can be picked up from the associated treatment stations.

Figure 8:
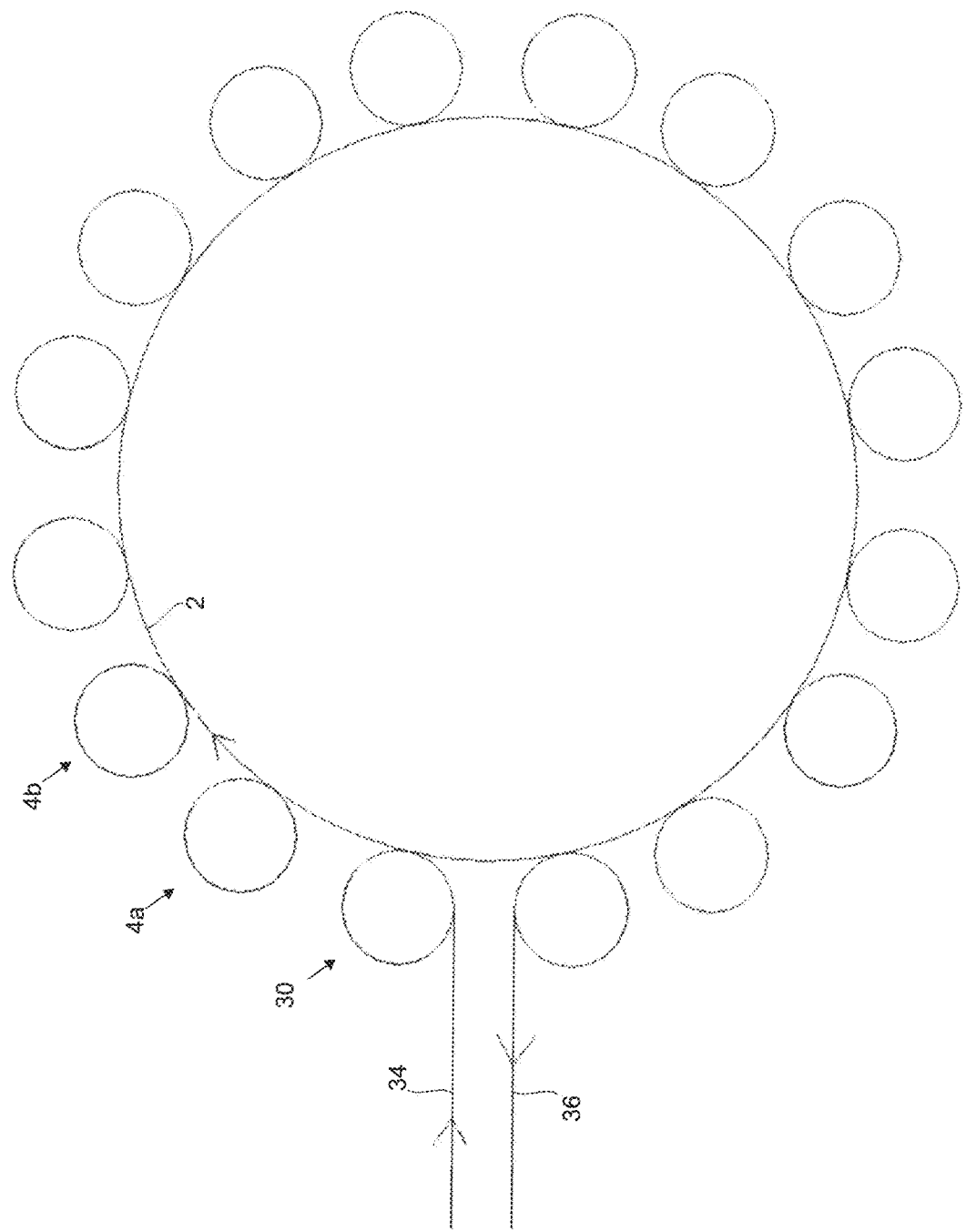
FIG. 8 shows a schematic representation of an exemplary embodiment of a device according to the invention with a transport carousel.

In FIG. 8 the transport device 2 is configured as a transport carousel. The manipulating devices 4 are arranged like satellites around the transport device 2, The containers are fed by means of an infeed 34 and an infeed starwheel 30 of the transport device and are removed by means of a discharge starwheel 32 and a discharge 36. In this exemplary embodiment the transport device rotates in a clockwise direction.

Figure 9:
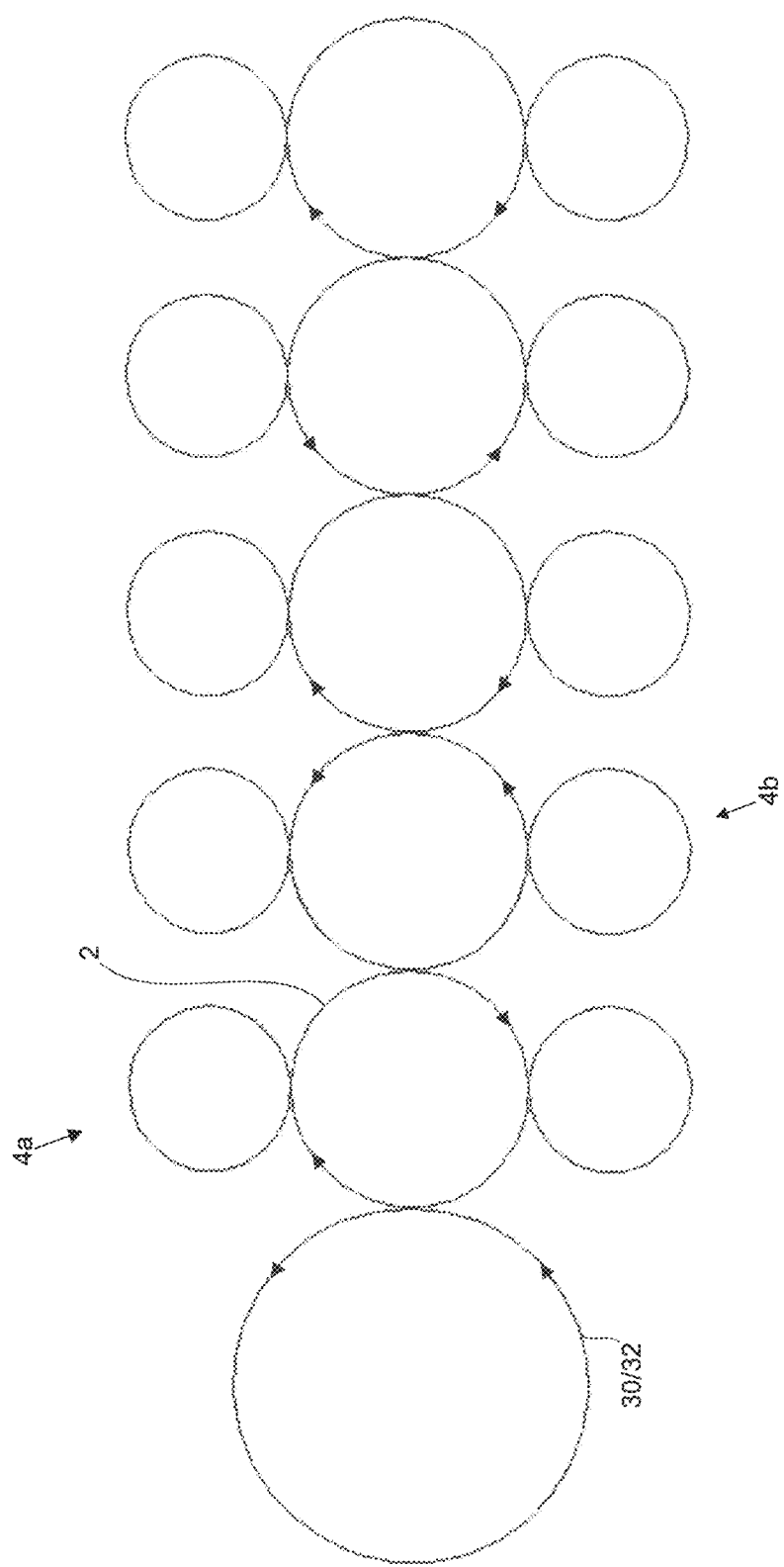
FIG. 9 shows a schematic representation of an exemplary embodiment of a device according to the invention with a starwheel column.

FIG. 9 shows an alternative embodiment. Here the transport device 2 is configured in the form of starwheel columns. The containers can again be fed by means of a starwheel acting both as infeed starwheel and also discharge starwheel 30/32 to the transport device 2. The containers are picked up by a first transfer starwheel, which rotates in a clockwise direction, passed on to a second transfer starwheel, which rotates anticlockwise, etc. In this way the containers travel a meandering path. The manipulating devices 4 are arranged to the side of the row of transfer starwheels.

Figure 10A:
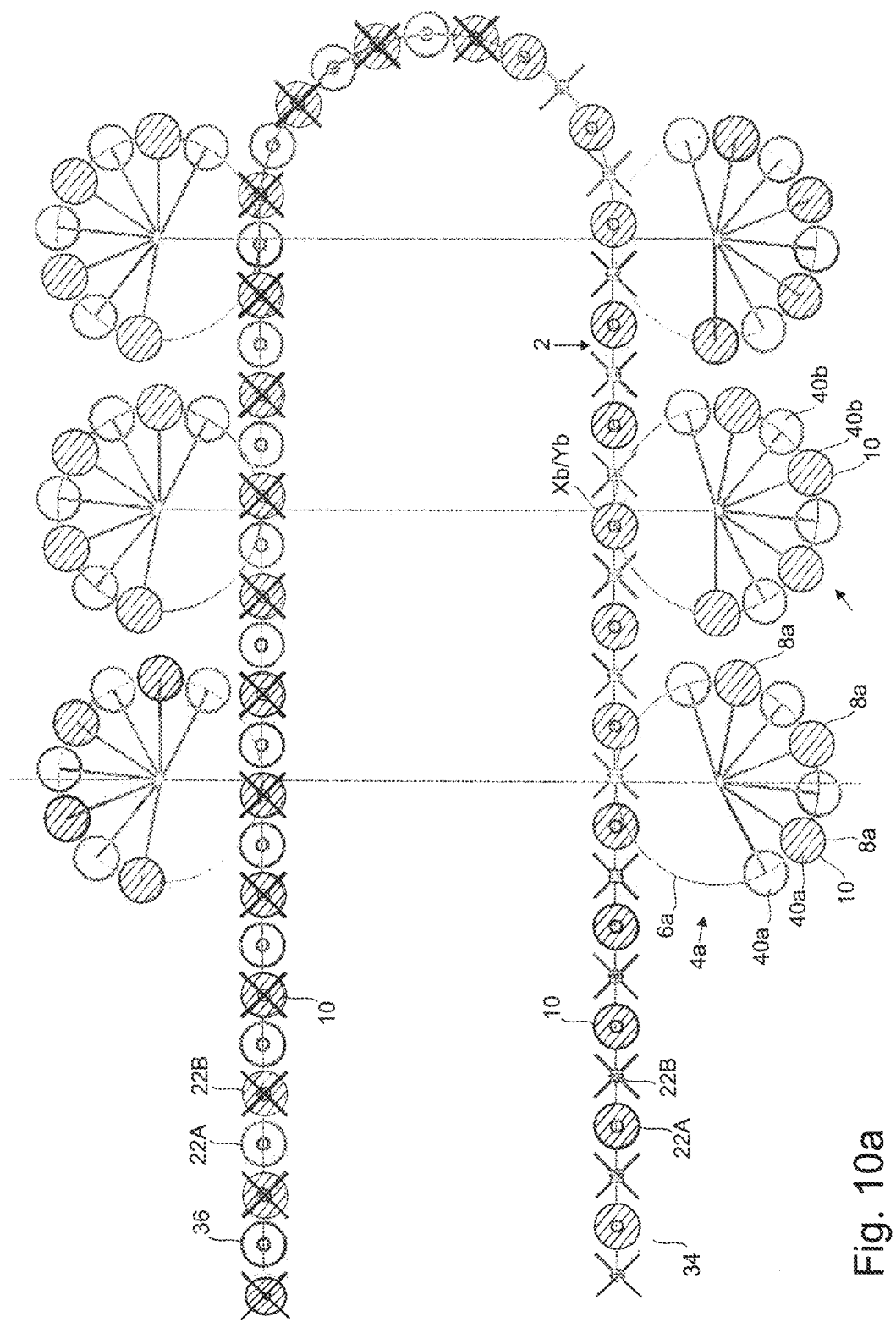
FIG. 10a shows a schematic representation of an exemplary embodiment of a device according to the invention, in which every second transport unit is occupied.
Figure 10B:
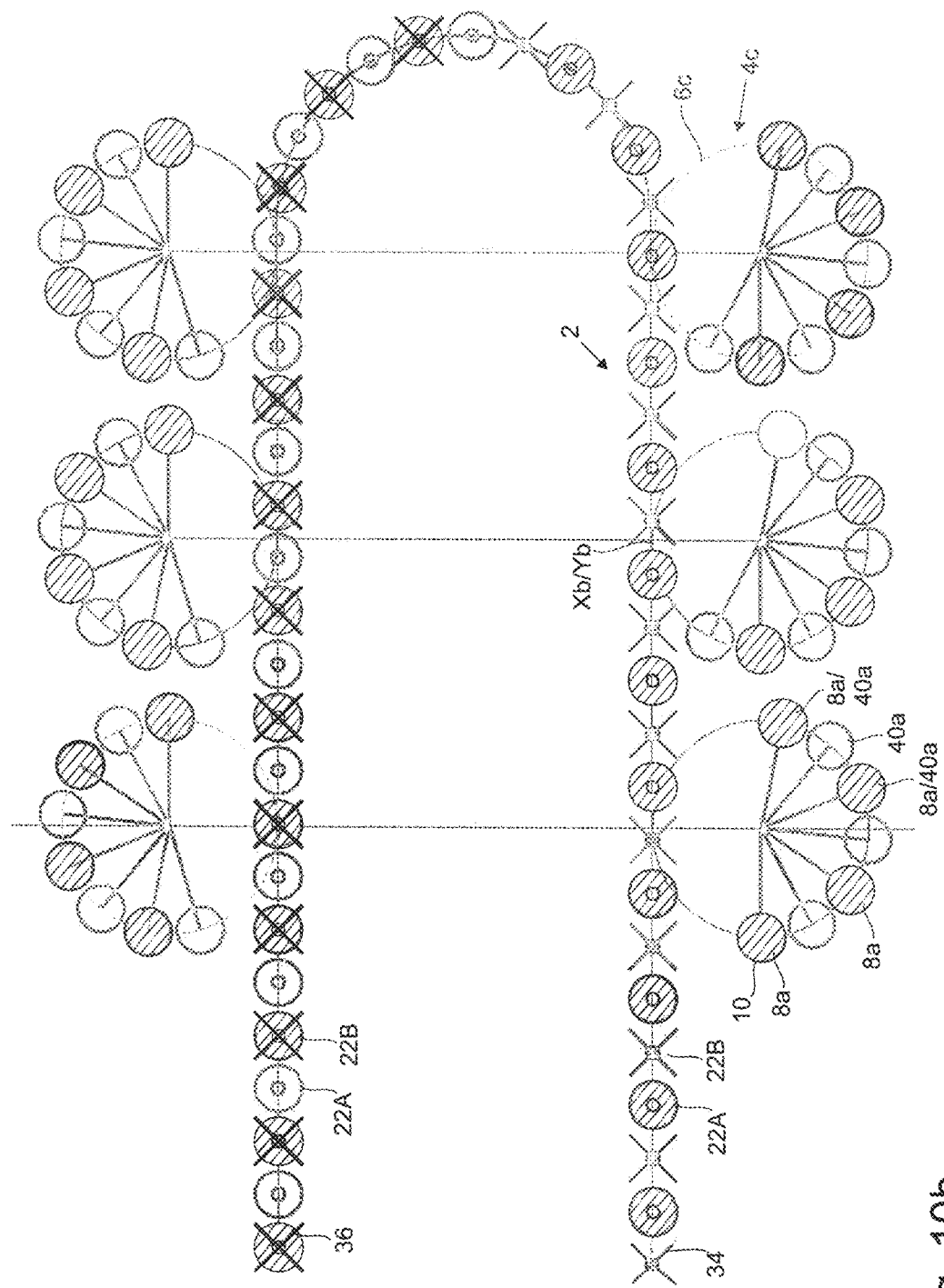
FIG. 10b shows a schematic representation of an exemplary embodiment of a device according to the invention, in which every second transport unit is occupied during a second cycle.

FIGS. 10a and 10b show the same embodiment of a device according to the invention at two different times. In both drawings it can be seen that the transport device 2 has a plurality of transport units 22. For differentiation the transport units are designated alternately with a circle (22A) or a cross (22B). Cross-hatched circles designate a container 10.

A plurality of manipulating devices 4 are arranged around the transport device 2. For example, it is shown that the manipulating device 4a has a support 6a and a plurality of manipulating units 40a (circles on radial lines). These manipulating units 40a are alternately occupied by a container 10 (cross-hatched circle) or unoccupied (unfilled circle). The treatment stations 8a (not shown separately) are located below the manipulating devices 40a occupied by a container 10.

Also, in the case of the manipulating device 4b it is shown for example that it consists of a plurality of manipulating units 40b, of which every second one is occupied by a container 10. The transfer region Xb and the delivery region Yb correspond.

During a method according to the invention the manipulating device 4b rotates for example out of this position in a clockwise direction. At the delivery point Yb it first of all delivers a treated container 10 from the first manipulating unit 40b to an unoccupied transport unit. After both the manipulating device 4b and also the transport device 2 have moved further in a synchronised manner, the transport device 2 transfers an untreated container 10 from the following occupied transport unit 22 to the second (unoccupied) manipulating unit 40*b*. The transport device 2 and the manipulating device 4*b* again rotate further in a synchronised manner. The manipulating device 4*b* delivers the next treated container from the third manipulating unit 40*b* to the next unoccupied transport unit 22, etc. Therefore, as can be seen, at the infeed 34 the transport units 22A (marked with a circle) are occupied by a container, whilst at the discharge 36 the transport units 22B (marked with a cross) are occupied by a container. Thus, it can be seen that the treated containers are transported by the transport units 22B, whilst the untreated containers are transported by the transport units 22A.

After all manipulating units 40*b* have delivered the treated containers, or have picked up new untreated containers, the manipulating device 4*b* rotates further to the position in which the manipulating units 40*b* occupied by containers are positioned above the treatment stations 8*b*, so that the containers 10 can be treated therein. As a comparison of FIGS. 10*a* and 10*b* shows, therefore, the manipulating devices 4 assume two different rest positions. Thus, for example the manipulating device 4*b* in FIG. 10*b* is further rotated about one rotational position: In FIG. 10*a* the last manipulating unit 40*b* is occupied by a container and is in the "9 o'clock position" directly above a treatment station 8*b*. In FIG. 10*b*, on the other hand, the last manipulating unit 40*b* is unoccupied and the penultimate manipulating unit 40*b* is occupied. In order that, here too, the container is located immediately above the treatment station 8*b*, the manipulating device 4*b* must be correspondingly further rotated.

In addition, a special feature can be seen: One of the manipulating devices (in this case manipulating device 4*a*) has one manipulating unit 40*a* less than the rest of manipulating devices 4*b*-4*f*. This is necessary, so that also in the discharge of the transport device 2 a continuous stream of containers is produced with alternating full-empty occupancy. With each cycle, the treated containers are inserted into the transport device 2 alternately before and after the untreated containers. In order to balance this alternation, one manipulating device 4*a* with a reduced number of manipulating units 40*a* is necessary.

Figure 11:
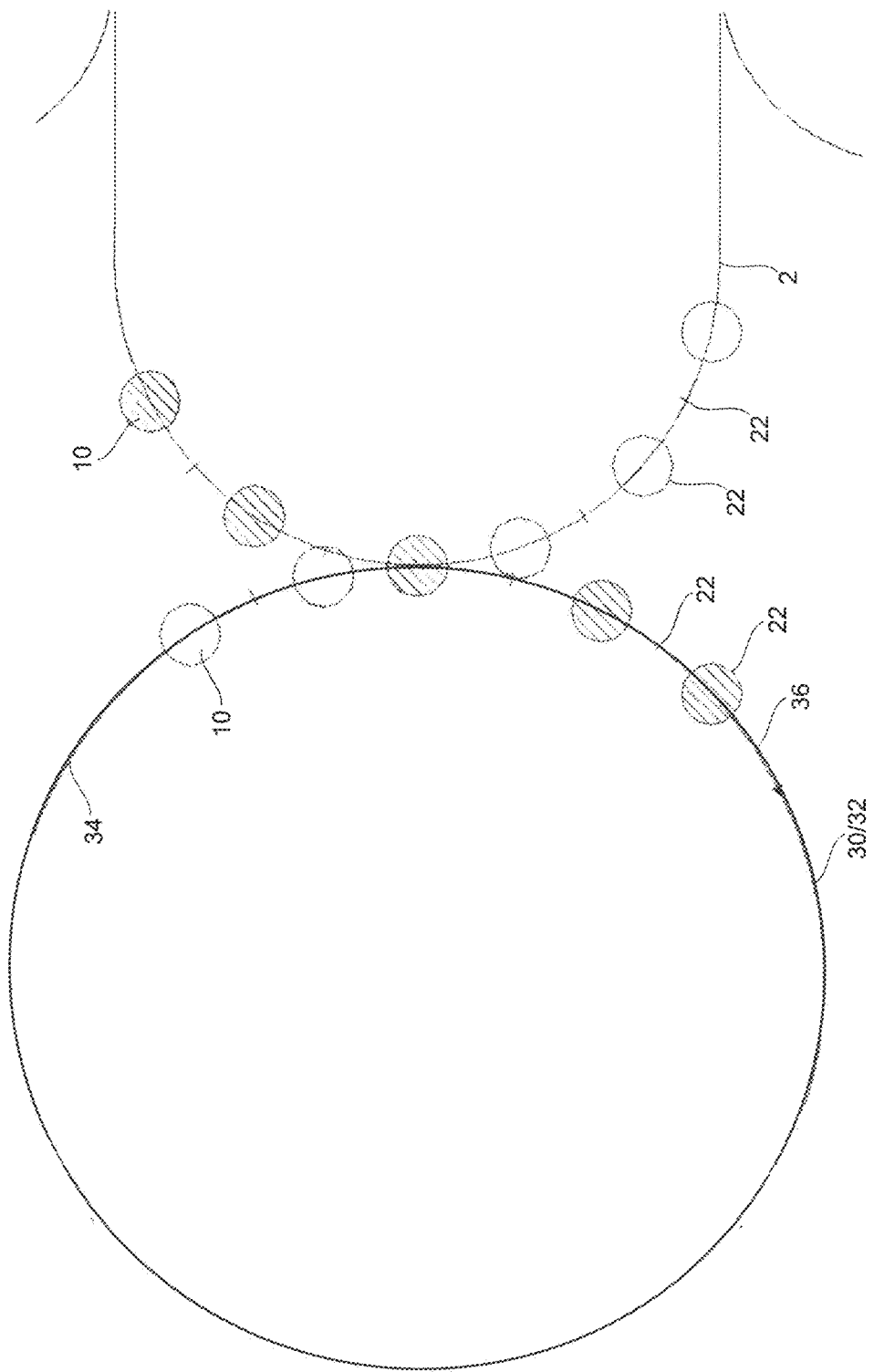
FIG. 11 shows an enlarged representation of the transfer region from a feed starwheel to a transport device.

FIG. 11 shows on an enlarged scale the infeed from the feed starwheel 30 to the transport device 2 or the discharge from the transport device. On both skies of the transfer point only every second transport unit 22 is occupied by a container 10. The unoccupied transport units 22 are designated by a dash. The untreated containers 10 are represented by an unfilled circle, and the treated containers are represented by a circle with a cross-hatched filling, dust one treated container 10, which is transferred from the transport device 2 to the infeed or discharge starwheel 30/32, is located at the transfer point. If the infeed or discharge stem/heel 30/32 and the transport device 2 rotate further, next an unoccupied transport unit 22 of the transport device 2 and an untreated container meet one another (at that moment both above the transfer point). Thus, the infeed or discharge starwheel 30/32 can deliver an untreated container to an unoccupied transport unit 22. With a further rotation, next a treated container 10 of the transport device 2 and an unoccupied transport unit 22 of the infeed or discharge starwheel 30/32 meet one another. Thus, the transport device 2 can deliver the treated container to the inflow or discharge starwheel 30/32.

Figure 12:
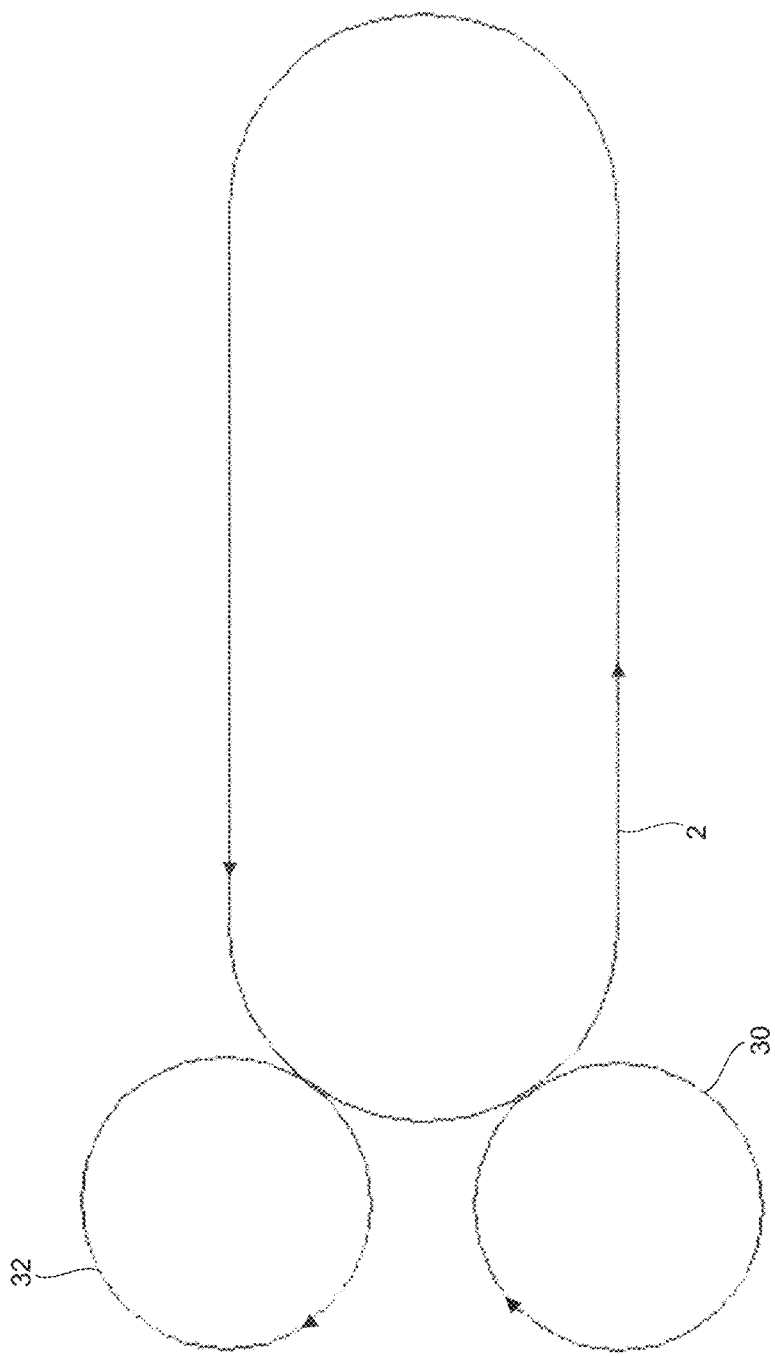
FIG. 12 shows a schematic representation of an exemplary embodiment of a device according to the invention with a separate feed and discharge starwheel.

FIG. 12 shows an alternative embodiment, in which the feed starwheel 30 and the discharge starwheel 32 are designed as separate starwheels.

Figure 13A:
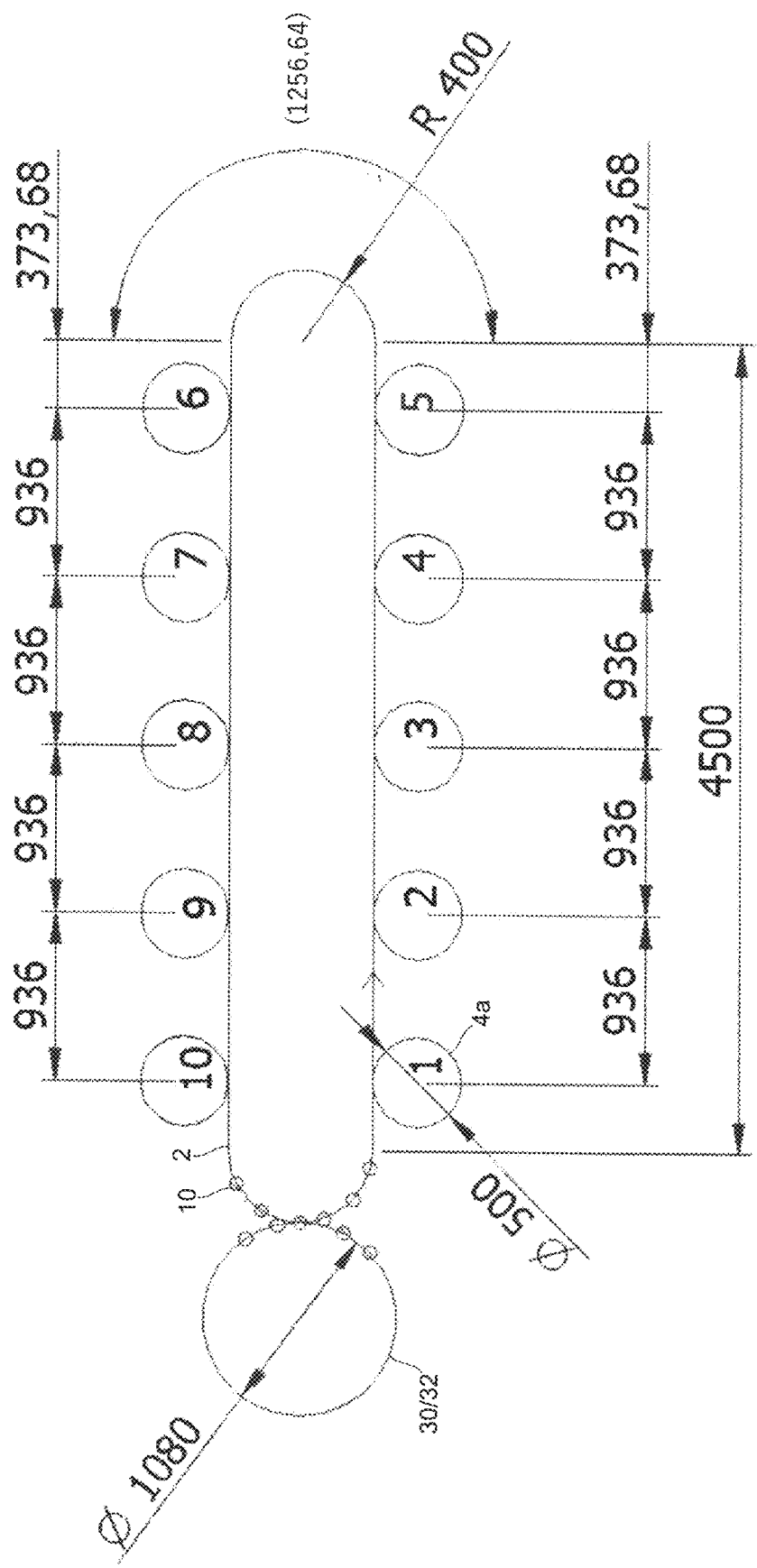
FIG. 13a shows a representation of an exemplary embodiment of a device according to the invention with size indications by way of example.

FIG. 13*a* shows a preferred embodiment with examples of dimensions, such as are advantageous in particular in the case of a container coating machine. Important dimensions here are in particular the dimensions 936 mm (distance between the transfer/delivery points X/Y), 373.68 mm (distance between the last transfer/delivery point and the start of the curvature of the transfer oval) and 8400 mm (radius of curvature of the transfer oval), that is to say the distances between the manipulation stations on the transport device 2. With this arrangement and a path speed of the transport device of 0.8 m/s (spacing of the transport units on the transport device: 120 mm) the result is a pitch of 1.185 s. With 10 stations the result is a cycle duration of 10×1.185 s=11.85 s.

In an exemplary coating process approximately 2 seconds must be estimated for evacuation of the vacuum chamber. However, since the next manipulating device already switches in after 1.185 s, two vacuum pumps are used here for the evacuation. Thus, each pump evacuates for only approximately 1 second. This is less than the 1.185 s available from the dock, that is to say as required there is no time overlap of the evacuation processes.

A favourable switching sequence of the 10 manipulating devices is shown in FIG. 13*b*. In this case the abbreviation "S1" relates to the manipulating device 4*a*, "S2" relates to the manipulating device 4*b*, etc.

Figure 14A:
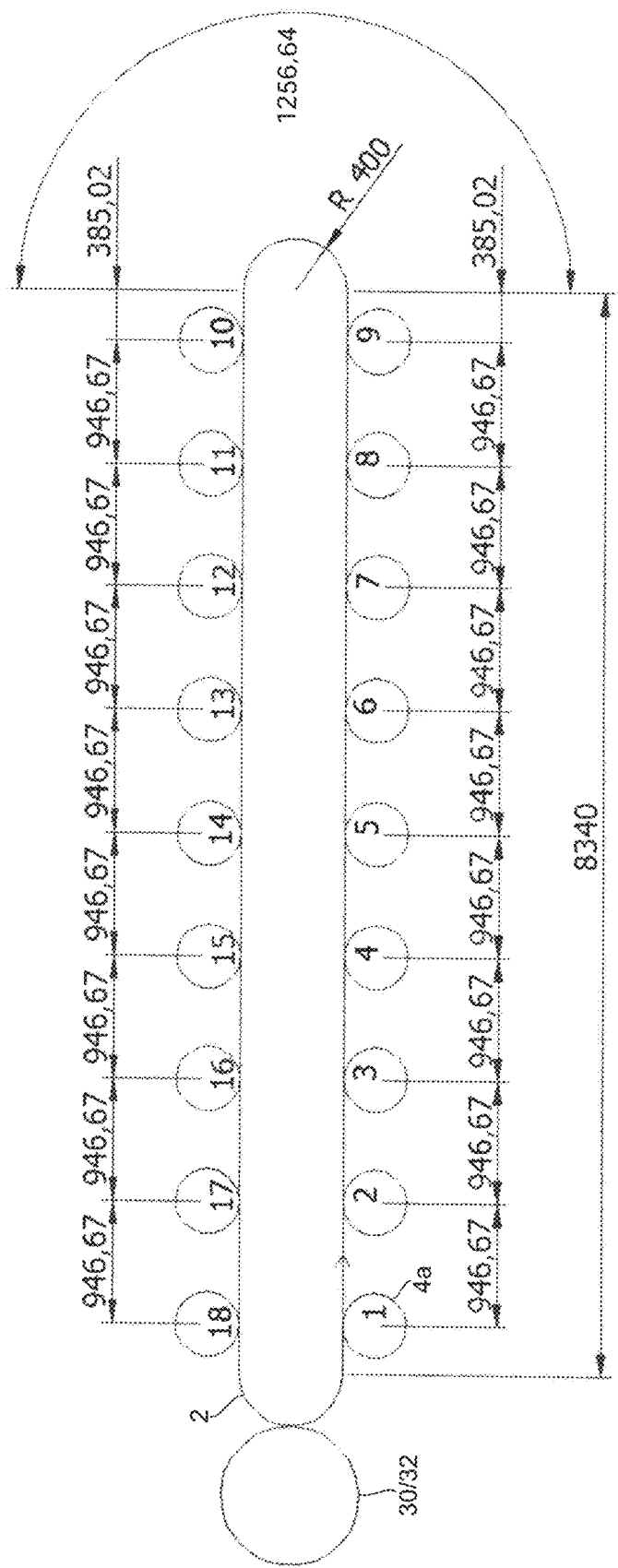
FIG. 14a shows a further representation of an exemplary embodiment of a device according to the invention with size indications by way of example.

A further preferred overall size is illustrated in FIG. 14*a* and the associated switching sequence is illustrated in FIG. 14*b*. A special feature here is the double vacuum supply. This is necessary, since on the basis of the geometric ratios a simultaneous cycling of two manipulating devices is not possible. Therefore, the stations 10-18 clock by 0.6 s offset to the stations 1-9.

Figure 15A:
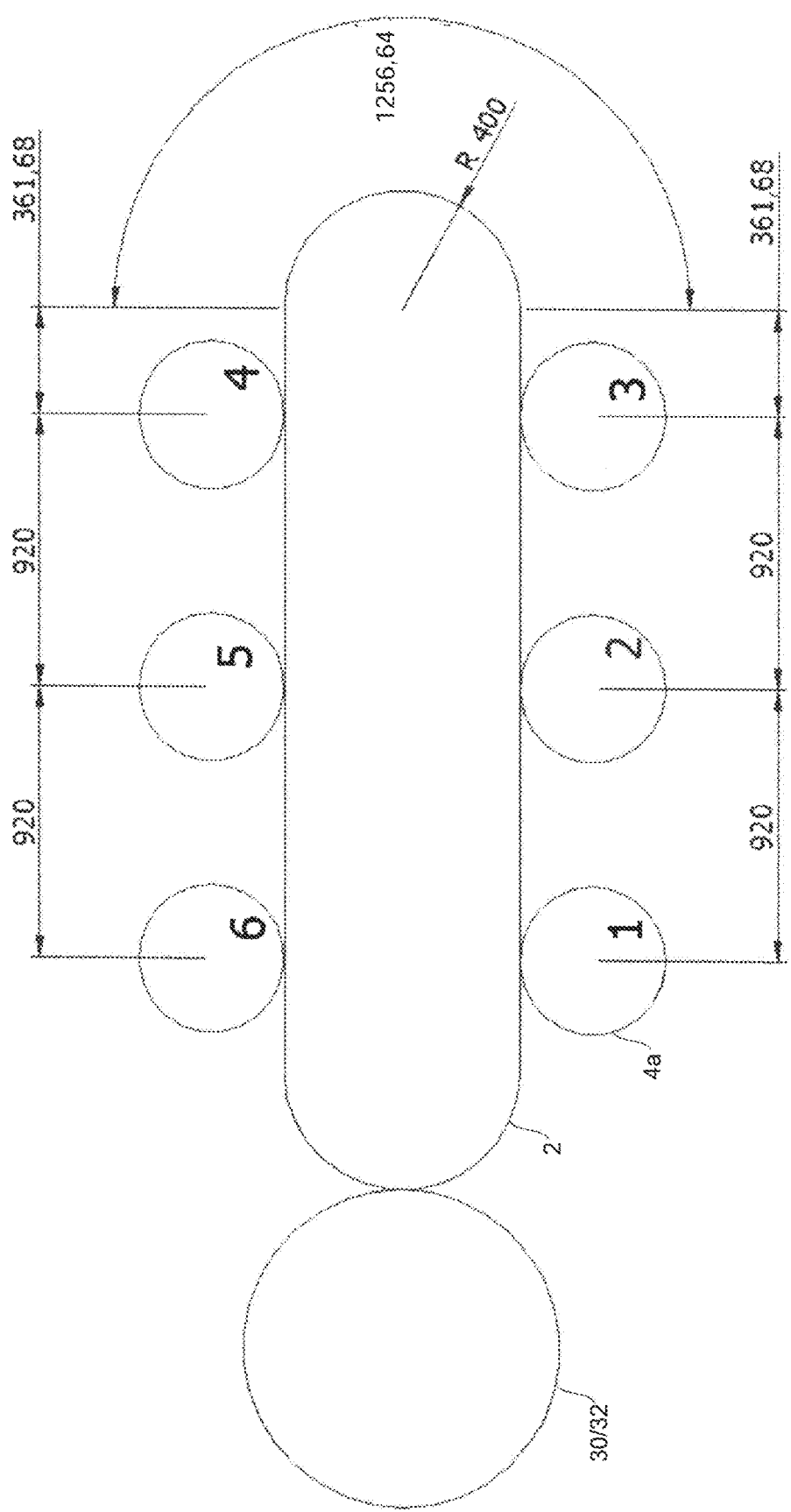
FIG. 15a shows a further representation of an exemplary embodiment of a device according to the invention with size indications by way of example.

A further preferred overall size is illustrated in FIG. 15*a* and the associated switching sequence is illustrated in FIG. 15*b*.

Figure 16:
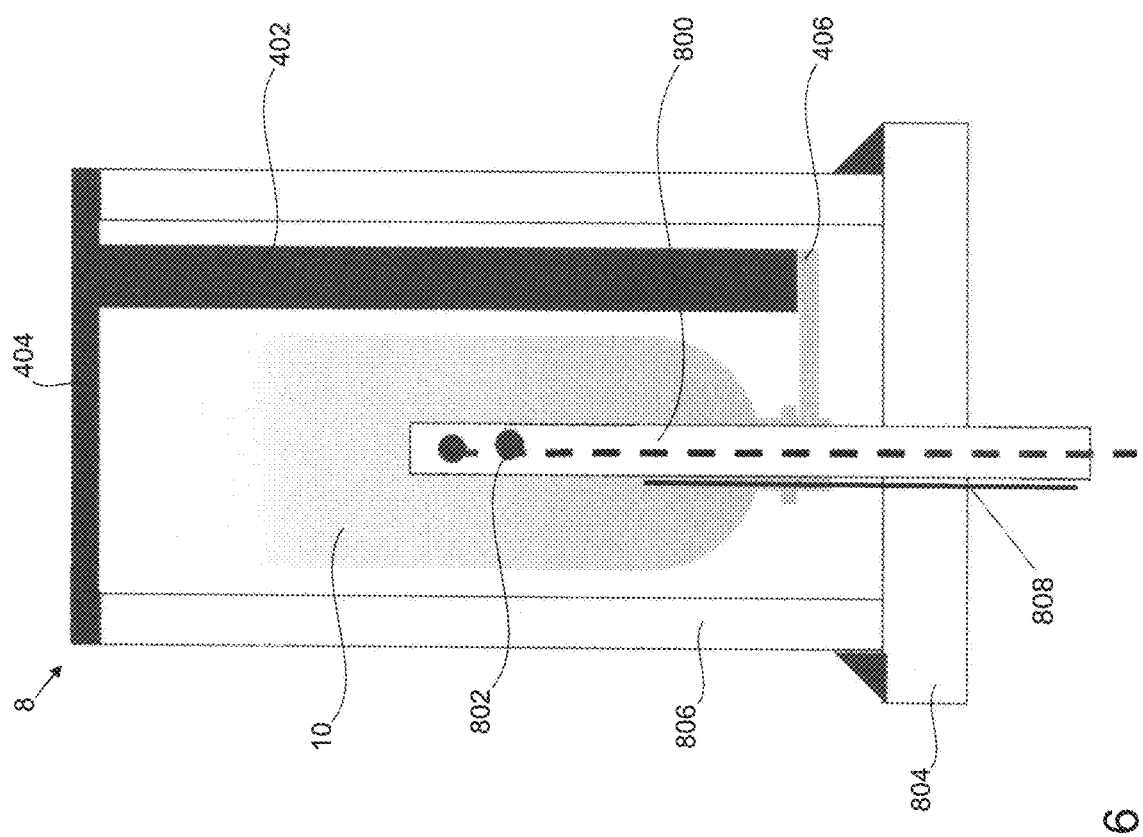
FIG. 16 shows a representation of a processing chamber and method for coating containers.

FIG. 16 shows a representation of a treatment station 8. A container 10 is introduced into the treatment station 8. This container is held by a support element 402 with the aid of a gripper 406. The support element 402 can be moved vertically upwards, so that the container 10 held by the gripper 406 is likewise moved vertically upwards and out of the treatment station 8.

The treatment station 8 comprises a stationary base part 804 and stationary walls 806. A closure element 404 is arranged on the support element 402. This is movable jointly with the support element 402. If the support element 402 is moved upwards, the closure element 404 is also lifted off from the walls 806 of the treatment station 8. If on the other hand—as illustrated—the support element 402 is located in its lowest position, the closure element 404 jointly with the walls 806 closes the treatment station 8 in an airtight manner.

Moreover, a processing device 800 is located in the treatment station 8. This is advantageously likewise arranged stationary, so tat the container 10 is pushed during introduction into the treatment station 8 by means of the treatment device 800. The treatment device 800 has a plurality of openings 802, through which advantageously plasma can be introduced into the interior of the container 10. In such case, the treatment device 800 may also sere as an electrode for plasma generation. Also, if desired a second electrode 808 may be introduced into the container 10.

The applicant reserves the right to claim all the features disclosed in the application documents as essential to the invention in so far as they are individually or in combination novel over the prior art. Furthermore, it is pointed out that features which may be advantageous per se have also been described in the individual drawings. The person skilled in the art recognises immediately that a specific feature described in a drawing may also be advantageous without the incorporation of further features from this drawing. Furthermore, the person skilled in the art recognises that advantages may also result from a combination of several features shown in individual drawings or in different drawings.

LIST OF REFERENCES 1 device
2/20 transport device
4(a, b, c, . . . ) manipulating device
6(a, b, c, . . . ) movable support
8(a, b, c, . . . ) treatment stations
10 container
22 (A, B) transport unit
30 feed star heel
32 discharge starwheel
34 infeed
36 discharge
40(a, b, c, . . . ) manipulating unit
402 support element
404 closure element
406 gripper
800 treatment device
802 openings
804 base part of the processing
806 wall of the processing
808 electrode
P(a, b, c, . . . ) transport path
X(a, b, c, . . . ) transfer region
Y(a, b, c, . . . ) delivery region

The invention claimed is:

1. A device for coating containers, said device comprising at least one vacuum device for generating a vacuum, and at least one treatment station for coating containers with a plasma, wherein the treatment station is in fluid communication with the vacuum device and wherein the treatment station has at least one treatment device configured for introduction into a container, said device further comprising a conveyor device for transporting containers on a transport path P and with at least one support element to receive at least one container, wherein the support element is movable in a direction different from zero relative to the transport path P of the containers, and wherein the support element is configured such that both a movement downwards or upwards and also a movement in a lateral direction relative to the transport path P takes place and is configured for introducing the container into the treatment station and for lifting the container out of the treatment station or lowering the container and pivoting the container to the conveyer device, wherein a closure element is arranged on the support element which closure element is configured for closing the treatment station in a substantially airtight manner.

2. The device according to claim 1, wherein the conveyor device is configured for moving the containers along a circumferential transport path.

3. The device according to claim 1, wherein the treatment station is arranged below or above the transport path P of the containers and/or the movement of the support element for introduction of the container into the treatment station takes place downwards or upwards.

4. The device according to claim 1, wherein the support element is configured to transport the containers with their openings downwards.

5. The device according to claim 1, wherein the treatment device has openings through which a flowable medium can be introduced into the containers.

6. The device according to claim 1, wherein the treatment device serves as an electrode for the plasma generation.

7. The device according to claim 6, wherein the treatment station has a second electrode.

8. A method for coating containers, wherein the container is transported with the aid of a conveyor device along a transport path P, is introduced into a treatment station with the aid of a support element in a direction different from zero relative to the transport path P, wherein the support element is configured such that both a movement downwards or upwards and also a movement in a lateral direction relative to the transport path P takes place, and a treatment device is introduced into the container, wherein the treatment station is evacuated in a subsequent step and the container is coated with a plasma, wherein a closure element arranged on the support element is moved towards the treatment station and the closure element closes the treatment station in a substantially airtight manner, wherein after the completion of the coating process the container is led out of the treatment station with the aid of the support element, and wherein with the aid of the support element the container is lowered into the treatment station for treatment, and after treatment the container is lifted out of the treatment station.

* * * * *